US012796534B2

United States Patent
(12) United States Patent
Katkar et al.

(10) Patent No.: US 12,796,534 B2
(45) Date of Patent: Nov. 10, 2026

(54) DIRECTLY BONDED STRUCTURES

(71) Applicant: ADEIA SEMICONDUCTOR BONDING TECHNOLOGIES INC., San Jose, CA (US)

(72) Inventors: Rajesh Katkar, Milpitas, CA (US); Belgacem Haba, Saratoga, CA (US); Paul M. Enquist, Cary, NC (US); Gaius Gillman Fountain, Jr., Youngsville, NC (US); Guilian Gao, San Jose, CA (US); Cyprian Emeka Uzoh, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 656 days.

(21) Appl. No.: 17/646,361

(22) Filed: Dec. 29, 2021

(65) Prior Publication Data

US 2022/0208723 A1 Jun. 30, 2022

Related U.S. Application Data

(60) Provisional application No. 63/132,400, filed on Dec. 30, 2020, provisional application No. 63/132,409, filed on Dec. 30, 2020.

(51) Int. Cl.
*H10W 90/00* (2026.01)
*H10W 72/00* (2026.01)

(52) U.S. Cl.
CPC ...... *H10W 90/00* (2026.01); *H10W 72/07331* (2026.01)

(58) Field of Classification Search
None
See application file for complete search history.

(56) References Cited

U.S. PATENT DOCUMENTS 5,051,802 A 9/1991 Prost et al.
5,753,536 A 5/1998 Sugiyama et al.
5,771,555 A 6/1998 Eda et al.
6,080,640 A 6/2000 Gardner et al.
6,423,640 B1 7/2002 Lee et al.
6,465,892 B1 10/2002 Suga
6,887,769 B2 5/2005 Kellar et al.
(Continued)

FOREIGN PATENT DOCUMENTS

CN 102209692 A 10/2011
CN 103199436 A 7/2013
(Continued)

OTHER PUBLICATIONS

Inoue, F. et al., "Influence of composition of SiCN as interfacial layer on plasma activated direct bonding," ECS Journal of Solid State Science and Technology, 2019, vol. 8, No. 6, pp. P346-P350.
(Continued)

*Primary Examiner* — Telly D Green
(74) *Attorney, Agent, or Firm* — Knobbe, Martens, Olson & Bear, LLP

(57) ABSTRACT

Embodiments of methods for producing direct bonded structures and methods for forming direct bonded structures are disclosed. The direct bonded structures may include elements comprising active electronics, microelectromechanical systems, optical elements, and so forth.

16 Claims, 11 Drawing Sheets

(56) References Cited

U.S. PATENT DOCUMENTS

| | | | |
|---|---|---|---|
| 6,908,027 | B2 | 6/2005 | Tolchinsky et al. |
| 6,984,571 | B1 | 1/2006 | Enquist |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,550,366 | B2 | 6/2009 | Suga et al. |
| 7,582,971 | B2 | 9/2009 | Kameyama et al. |
| 7,663,231 | B2 | 2/2010 | Chang et al. |
| 7,686,912 | B2 | 3/2010 | Suga et al. |
| 7,750,488 | B2 | 7/2010 | Patti et al. |
| 7,759,751 | B2 | 7/2010 | Ono |
| 7,803,693 | B2 | 9/2010 | Trezza |
| 7,906,410 | B2 | 3/2011 | Arita et al. |
| 8,168,458 | B2 | 5/2012 | Do et al. |
| 8,183,127 | B2 | 5/2012 | Patti et al. |
| 8,193,632 | B2 | 6/2012 | Chang et al. |
| 8,263,434 | B2 | 9/2012 | Pagaila et al. |
| 8,268,699 | B2 | 9/2012 | Park et al. |
| 8,318,586 | B2 | 11/2012 | Libralesso et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,505,197 | B2 | 8/2013 | Blanchard |
| 8,524,533 | B2 | 9/2013 | Tong et al. |
| 8,552,567 | B2 * | 10/2013 | England .................. H01L 22/10 257/777 |
| 8,618,659 | B2 | 12/2013 | Sato et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,791,575 | B2 | 7/2014 | Oganesian et al. |
| 8,802,538 | B1 | 8/2014 | Liu |
| 8,809,123 | B2 | 8/2014 | Liu et al. |
| 8,841,002 | B2 | 9/2014 | Tong |
| 8,866,305 | B2 | 10/2014 | Sadaka et al. |
| 8,878,353 | B2 | 11/2014 | Haba et al. |
| 8,947,931 | B1 * | 2/2015 | D'Abreu ............. H01L 25/0652 365/185.11 |
| 9,018,079 | B1 | 4/2015 | Lei et al. |
| 9,076,860 | B1 | 7/2015 | Lei et al. |
| 9,093,350 | B2 | 7/2015 | Endo et al. |
| 9,136,293 | B2 | 9/2015 | Yee et al. |
| 9,142,459 | B1 | 9/2015 | Kumar et al. |
| 9,142,517 | B2 | 9/2015 | Liu et al. |
| 9,142,532 | B2 | 9/2015 | Suga et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,252,172 | B2 | 2/2016 | Chow et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,391,143 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,476,898 | B2 | 10/2016 | Takano |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,666,573 | B1 | 5/2017 | Sukekawa et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,870,922 | B2 | 1/2018 | Suga et al. |
| 9,893,004 | B2 | 2/2018 | Yazdani |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 9,971,777 | B2 | 5/2018 | Bertin et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,269,853 | B2 | 4/2019 | Katkar et al. |
| 10,276,619 | B2 | 4/2019 | Kao et al. |
| 10,276,909 | B2 | 4/2019 | Huang et al. |
| 10,319,699 | B2 * | 6/2019 | Wei ......................... H01L 24/03 |
| 10,418,277 | B2 | 9/2019 | Cheng et al. |
| 10,434,749 | B2 * | 10/2019 | Tong ................... B81C 1/00357 |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,515,925 | B2 | 12/2019 | Uzoh |
| 10,522,499 | B2 | 12/2019 | Enquist et al. |
| 10,541,228 | B2 * | 1/2020 | Chen ................... H01L 25/0655 |
| 10,566,219 | B2 | 2/2020 | Kurita et al. |
| 10,580,932 | B2 * | 3/2020 | Hayashi ................. H10H 20/01 |
| 10,651,149 | B2 * | 5/2020 | Chen ................... H01L 23/5386 |
| 10,707,087 | B2 | 7/2020 | Uzoh et al. |
| 10,714,449 | B2 | 7/2020 | Uzoh |
| 10,727,201 | B2 * | 7/2020 | Chen ..................... H01L 23/481 |
| 10,727,219 | B2 | 7/2020 | Uzoh et al. |
| 10,770,430 | B1 * | 9/2020 | Kim ........................ H01L 25/50 |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,937,755 | B2 | 3/2021 | Shah et al. |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,158,606 | B2 | 10/2021 | Gao et al. |
| 11,171,117 | B2 | 11/2021 | Gao et al. |
| 11,176,450 | B2 | 11/2021 | Teig et al. |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,329,034 | B2 | 5/2022 | Tao et al. |
| 11,348,898 | B2 | 5/2022 | DeLaCruz et al. |
| 11,355,443 | B2 | 6/2022 | Huang et al. |
| 11,664,357 | B2 | 5/2023 | Fountain, Jr. et al. |
| 11,670,617 | B2 * | 6/2023 | Chen ..................... H01L 23/473 257/751 |
| 11,710,718 | B2 | 7/2023 | Uzoh |
| 11,742,314 | B2 | 8/2023 | Uzoh et al. |
| 11,742,315 | B2 | 8/2023 | Uzoh |
| 11,855,064 | B2 | 12/2023 | Uzoh et al. |
| 2002/0003307 | A1 | 1/2002 | Suga |

(56) References Cited

U.S. PATENT DOCUMENTS

2002/0048906 A1 4/2002 Sakai et al.
2002/0053730 A1 5/2002 Mashino
2004/0058476 A1 3/2004 Enquist et al.
2004/0084414 A1 5/2004 Sakai et al.
2004/0235266 A1* 11/2004 Tong .................... H01L 24/81 438/455
2005/0009246 A1 1/2005 Enquist et al.
2005/0031795 A1 2/2005 Chaudhury et al.
2006/0057945 A1 3/2006 Hsu et al.
2006/0087042 A1 4/2006 Kameyama et al.
2007/0075417 A1* 4/2007 Hwang ................ B81B 7/0077 257/704
2007/0111386 A1 5/2007 Kim et al.
2007/0224733 A1 9/2007 Boyle et al.
2008/0308928 A1 12/2008 Chang
2009/0227089 A1 9/2009 Plaut et al.
2009/0298264 A1 12/2009 Arai et al.
2010/0006784 A1 1/2010 Mack et al.
2010/0167534 A1 7/2010 Iwata
2011/0027930 A1 2/2011 El-Gamal et al.
2011/0101373 A1 5/2011 Arena et al.
2011/0175243 A1 7/2011 Jo et al.
2012/0077329 A1 3/2012 Broekaart et al.
2012/0098140 A1* 4/2012 Bartley .................. H01L 25/18 257/E23.174
2012/0187516 A1 7/2012 Sato
2012/0194719 A1 8/2012 Churchwell et al.
2013/0026643 A1* 1/2013 England ................. H01L 22/10 257/777
2013/0153093 A1 6/2013 Vandroux et al.
2013/0252399 A1 9/2013 Leduc et al.
2013/0270328 A1 10/2013 Di Cioccio et al.
2014/0001949 A1 1/2014 Kimura et al.
2014/0011324 A1 1/2014 Liu et al.
2014/0167292 A1* 6/2014 Masumura ............. H01L 24/48 257/784
2014/0175655 A1 6/2014 Chen et al.
2014/0312511 A1 10/2014 Nakamura et al.
2014/0314370 A1 10/2014 Hatori et al.
2015/0031189 A1 1/2015 Chen et al.
2015/0064498 A1 3/2015 Tong
2015/0118825 A1 4/2015 Ishizuka
2015/0255349 A1 9/2015 Holden et al.
2015/0314385 A1 11/2015 Abe et al.
2016/0126218 A1 5/2016 Kurita
2016/0190103 A1 6/2016 Kabe et al.
2016/0343682 A1 11/2016 Kawasaki
2017/0207196 A1 7/2017 Lee et al.
2018/0005977 A1 1/2018 Lin et al.
2018/0012686 A1 1/2018 Huang et al.
2018/0012787 A1 1/2018 Oka et al.
2018/0040548 A1 2/2018 Kim et al.
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0219038 A1 8/2018 Gambino et al.
2018/0254260 A1* 9/2018 Wei .................... H01L 25/0652
2018/0308819 A1 10/2018 Uzoh
2018/0323177 A1 11/2018 Yu et al.
2018/0323227 A1 11/2018 Zhang et al.
2018/0331066 A1 11/2018 Uzoh et al.
2018/0366437 A1* 12/2018 Chen .................. H01L 23/5389
2019/0006263 A1 1/2019 Yu et al.
2019/0043914 A1 2/2019 Von Känel
2019/0051628 A1 2/2019 Liu et al.
2019/0096741 A1 3/2019 Uzoh et al.
2019/0096852 A1* 3/2019 Chen .................... H01L 23/467
2019/0115277 A1 4/2019 Yu et al.
2019/0131277 A1 5/2019 Yang et al.
2019/0157333 A1 5/2019 Tsai
2019/0189603 A1 6/2019 Wang et al.
2019/0198409 A1 6/2019 Katkar et al.
2019/0199058 A1 6/2019 Pierer et al.
2019/0244946 A1* 8/2019 Kim ...................... H01L 23/552
2019/0252364 A1 8/2019 Uzoh et al.
2019/0259743 A1* 8/2019 Han .................... H01L 25/0657
2019/0265411 A1 8/2019 Huang et al.
2019/0324222 A1 10/2019 Kettler et al.
2019/0326252 A1 10/2019 Mandalapu et al.
2019/0333550 A1 10/2019 Fisch
2019/0344533 A1* 11/2019 Tong ...................... H01L 24/92
2019/0358955 A1 11/2019 Giusti et al.
2019/0371761 A1 12/2019 Uzoh et al.
2019/0385935 A1 12/2019 Gao et al.
2019/0385966 A1 12/2019 Gao et al.
2020/0006266 A1 1/2020 Chen et al.
2020/0013637 A1 1/2020 Haba
2020/0013754 A1 1/2020 Gao et al.
2020/0013765 A1 1/2020 Fountain, Jr. et al.
2020/0035641 A1 1/2020 Fountain, Jr. et al.
2020/0075520 A1 3/2020 Gao et al.
2020/0075553 A1 3/2020 DeLaCruz et al.
2020/0091113 A1* 3/2020 Chen .................... H01L 23/467
2020/0118973 A1 4/2020 Wang et al.
2020/0126906 A1 4/2020 Uzoh et al.
2020/0161263 A1 5/2020 Chen et al.
2020/0194396 A1 6/2020 Uzoh
2020/0227367 A1 7/2020 Haba et al.
2020/0243380 A1 7/2020 Uzoh et al.
2020/0279821 A1 9/2020 Haba et al.
2020/0294908 A1 9/2020 Haba et al.
2020/0299127 A1 9/2020 Brioschi et al.
2020/0321307 A1 10/2020 Uzoh
2020/0328162 A1 10/2020 Haba et al.
2020/0328164 A1 10/2020 DeLaCruz et al.
2020/0328165 A1 10/2020 DeLaCruz et al.
2020/0335408 A1 10/2020 Gao et al.
2020/0335479 A1* 10/2020 Li ...................... H01L 21/6836
2020/0343218 A1* 10/2020 Hu ........................ H01L 24/80
2020/0357769 A1* 11/2020 Chen .................. H01L 23/5386
2020/0371154 A1 11/2020 DeLaCruz et al.
2020/0395321 A1 12/2020 Katkar et al.
2020/0402960 A1* 12/2020 Chen .................. H01L 23/3121
2020/0411483 A1 12/2020 Uzoh et al.
2021/0098412 A1* 4/2021 Haba .................. H01L 21/6835
2021/0118864 A1 4/2021 DeLaCruz et al.
2021/0143125 A1 5/2021 DeLaCruz et al.
2021/0143126 A1* 5/2021 Choi .................. H01L 25/0652
2021/0175280 A1 6/2021 Chae et al.
2021/0181510 A1 6/2021 Katkar et al.
2021/0193603 A1 6/2021 Katkar et al.
2021/0193624 A1 6/2021 DeLaCruz et al.
2021/0193625 A1 6/2021 DeLaCruz et al.
2021/0202567 A1 7/2021 Kim et al.
2021/0242152 A1 8/2021 Fountain, Jr. et al.
2021/0257253 A1* 8/2021 Katkar .................... H01L 21/68
2021/0296282 A1 9/2021 Gao et al.
2021/0305202 A1 9/2021 Uzoh et al.
2021/0366820 A1 11/2021 Uzoh
2021/0375850 A1 12/2021 Uzoh et al.
2021/0407941 A1 12/2021 Haba
2022/0077063 A1 3/2022 Haba
2022/0077087 A1 3/2022 Haba
2022/0093492 A1 3/2022 Elsherbini et al.
2022/0130883 A1* 4/2022 Kilcoyne ................ H10F 39/80
2022/0139867 A1 5/2022 Uzoh
2022/0139869 A1 5/2022 Gao et al.
2022/0199560 A1 6/2022 Haba et al.
2022/0208650 A1 6/2022 Gao et al.
2022/0208702 A1 6/2022 Uzoh
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.

(56) References Cited

U.S. PATENT DOCUMENTS

| | | | |
|---|---|---|---|
| 2023/0115122 | A1 | 4/2023 | Uzoh et al. |
| 2023/0122531 | A1 | 4/2023 | Uzoh |
| 2023/0123423 | A1 | 4/2023 | Gao et al. |
| 2023/0125395 | A1 | 4/2023 | Gao et al. |
| 2023/0130259 | A1 | 4/2023 | Haba et al. |
| 2023/0132632 | A1 | 5/2023 | Katkar et al. |
| 2023/0140107 | A1 | 5/2023 | Uzoh et al. |
| 2023/0142680 | A1 | 5/2023 | Guevara et al. |
| 2023/0154816 | A1 | 5/2023 | Haba et al. |
| 2023/0154828 | A1 | 5/2023 | Haba et al. |
| 2023/0187264 | A1 | 6/2023 | Uzoh et al. |
| 2023/0187317 | A1 | 6/2023 | Uzoh |
| 2023/0187412 | A1 | 6/2023 | Gao et al. |
| 2023/0197453 | A1 | 6/2023 | Fountain, Jr. et al. |
| 2023/0197496 | A1 | 6/2023 | Theil |
| 2023/0197559 | A1 | 6/2023 | Haba et al. |
| 2023/0197560 | A1 | 6/2023 | Katkar et al. |
| 2023/0197655 | A1 | 6/2023 | Theil et al. |
| 2023/0207402 | A1 | 6/2023 | Fountain, Jr. et al. |
| 2023/0207437 | A1 | 6/2023 | Haba |
| 2023/0207474 | A1 | 6/2023 | Uzoh et al. |
| 2023/0207514 | A1 | 6/2023 | Gao et al. |
| 2023/0215836 | A1 | 7/2023 | Haba et al. |
| 2023/0245950 | A1 | 8/2023 | Haba et al. |
| 2023/0268300 | A1 | 8/2023 | Uzoh et al. |
| 2023/0299029 | A1 | 9/2023 | Theil et al. |
| 2023/0343734 | A1 | 10/2023 | Uzoh et al. |
| 2023/0360950 | A1 | 11/2023 | Gao |
| 2023/0361074 | A1 | 11/2023 | Uzoh et al. |
| 2023/0369136 | A1 | 11/2023 | Uzoh et al. |
| 2023/0375613 | A1 | 11/2023 | Haba et al. |
| 2024/0021572 | A1 | 1/2024 | Uzoh |
| 2024/0021573 | A1 | 1/2024 | Uzoh et al. |
| 2024/0038702 | A1 | 2/2024 | Uzoh |
| 2024/0055407 | A1 | 2/2024 | Workman |
| 2024/0063076 | A1 | 2/2024 | Kabir et al. |
| 2024/0063089 | A1 | 2/2024 | Elsherbini et al. |
| 2024/0079376 | A1 | 3/2024 | Suwito et al. |
| 2024/0105674 | A1 | 3/2024 | Uzoh et al. |
| 2024/0170411 | A1 | 5/2024 | Chang et al. |
| 2024/0186248 | A1 | 6/2024 | Haba et al. |
| 2024/0186268 | A1 | 6/2024 | Uzoh et al. |
| 2024/0186269 | A1 | 6/2024 | Haba |
| 2024/0203917 | A1 | 6/2024 | Katkar et al. |
| 2024/0213191 | A1 | 6/2024 | Theil et al. |
| 2024/0213210 | A1 | 6/2024 | Haba et al. |
| 2024/0217210 | A1 | 7/2024 | Zhao et al. |
| 2024/0222239 | A1 | 7/2024 | Gao et al. |
| 2024/0222315 | A1 | 7/2024 | Uzoh |
| 2024/0222319 | A1 | 7/2024 | Gao et al. |
| 2024/0266255 | A1 | 8/2024 | Haba et al. |
| 2024/0298454 | A1 | 9/2024 | Haba |
| 2024/0304593 | A1 | 9/2024 | Uzoh |
| 2024/0312951 | A1 | 9/2024 | Theil et al. |
| 2024/0332184 | A1 | 10/2024 | Katkar et al. |
| 2024/0332227 | A1 | 10/2024 | Uzoh et al. |
| 2024/0332231 | A1 | 10/2024 | Uzoh |
| 2024/0332267 | A1 | 10/2024 | Haba et al. |
| 2024/0387419 | A1 | 11/2024 | Mrozek et al. |
| 2025/0004197 | A1 | 1/2025 | Haba et al. |
| 2025/0006632 | A1 | 1/2025 | Chang et al. |
| 2025/0006642 | A1 | 1/2025 | Haba et al. |
| 2025/0006674 | A1 | 1/2025 | Uzoh et al. |
| 2025/0006679 | A1 | 1/2025 | Theil et al. |
| 2025/0006689 | A1 | 1/2025 | Uzoh et al. |
| 2025/0054854 | A1 | 2/2025 | Katkar et al. |
| 2025/0079364 | A1 | 3/2025 | Uzoh et al. |
| 2025/0096191 | A1 | 3/2025 | Gao et al. |
| 2025/0112123 | A1 | 4/2025 | Katkar et al. |
| 2025/0167173 | A1* | 5/2025 | Chen .................... H01L 23/367 |
| 2025/0185163 | A1 | 6/2025 | Zhao et al. |
| 2025/0210585 | A1 | 6/2025 | Fountain, Jr. et al. |
| 2025/0212554 | A1 | 6/2025 | Katkar et al. |
| 2025/0218903 | A1 | 7/2025 | Uzoh et al. |
| 2025/0273517 | A1 | 8/2025 | Lee et al. |
| 2026/0033312 | A1 | 1/2026 | Katkar |

FOREIGN PATENT DOCUMENTS

| | | | |
|---|---|---|---|
| CN | 104246971 | A | 12/2014 |
| CN | 106409650 | A | 2/2017 |
| CN | 107331759 | A | 11/2017 |
| EP | 1011133 | A1 | 6/2000 |
| JP | 2002-353416 | A | 12/2002 |
| JP | 2008-130603 | A | 6/2008 |
| JP | 2008-244080 | A | 10/2008 |
| JP | 2009-514185 | A | 4/2009 |
| JP | 2010-066231 | A | 3/2010 |
| JP | 2011-104633 | A | 6/2011 |
| JP | 2013-033786 | A | 2/2013 |
| JP | 2013-507792 | A | 3/2013 |
| JP | 2015-517217 | A | 6/2015 |
| JP | 2016-072316 | A | 5/2016 |
| JP | 2018-160519 | | 10/2018 |
| JP | 2020-520128 | A | 7/2020 |
| KR | 2020-0002629 | A | 1/2020 |
| TW | 201401573 | A | 1/2014 |
| TW | 201423873 | A | 6/2014 |
| TW | 201612965 | A | 4/2016 |
| WO | WO 00/59006 | A1 | 10/2000 |
| WO | WO 2005/043584 | A2 | 5/2005 |
| WO | WO 2007/021639 | A2 | 2/2007 |
| WO | WO 2008/112101 | A2 | 9/2008 |
| WO | WO 2009/158378 | A2 | 12/2009 |
| WO | WO 2012/133760 | A1 | 7/2014 |
| WO | WO 2016/003709 | A1 | 1/2016 |
| WO | WO 2018/034746 | A1 | 2/2018 |
| WO | WO 2018/194827 | A1 | 10/2018 |
| WO | WO 2020/104232 | A1 | 5/2020 |

OTHER PUBLICATIONS

Ker, Ming-Dou et al., "Fully process-compatible layout design on bond pad to improve wire bond reliability in CMOS lcs," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.

Plobi, A. et al., "Wafer direct bonding: tailoring adhesion between brittle materials," Materials Science and Engineering Review Journal, 1999, R25, 88 pages.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Claims from U.S. Appl. No. 17/452,753, filed Oct. 28, 2021 (Year: 2021)—4 pages.

Claims from U.S. Appl. No. 17/657,332, filed Jun. 7, 2022 (Year : 2022)—4 pages.

(56) References Cited

OTHER PUBLICATIONS

Lei, Wei-Sheng et al., "Die singulation technologies for advanced packaging: A critical review," J. Vac. Sci. Technol. B, Jul./Aug. 2012, vol. 30, No. 4, pp. 040801-1-040801-27.
Luo, X. et al., "High-throughput multiple dies-to-wafer bonding technology and III/V-on-Si hybrid lasers for heterogeneous integration of optoelectronic integrated circuits," Frontiers in Materials, Apr. 2015, vol. 2, Article 28, pp. 1-21.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "ONSEMI AR0820.".
Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).
International Search Report and Written Opinion, dated Apr. 22, 2022, for International Application No. PCT/US2021/073170, 17 pages.
European Extended Search Report dated Jun. 30, 2025 for Application No. 21916614.7, 8 pages.
Taiwanese Office Action, dated Jan. 2, 2026, for TW Application No. 110149390, 15 pages.

* cited by examiner

DIRECTLY BONDED STRUCTURES

INCORPORATION BY REFERENCE TO ANY PRIORITY APPLICATIONS

Any and all applications for which a foreign or domestic priority claim is identified in the Application Data Sheet as file with the present application are hereby incorporated by reference under 37 CFR 1.57.

This application claims the benefit under 35 U.S.C. 119(e) to U.S. Provisional Application No. 63/132,409, entitled "DIRECTLY BONDED STRUCTURES," filed on Dec. 30, 2020, and to U.S. Provisional Application No. 63/132,400, entitled "DIRECTLY BONDED STRUCTURES," file on Dec. 30, 2020, and the entirety of both provisional application is hereby incorporated by reference herein.

BACKGROUND

Field

The field relates to directly bonded structures.

Description of the Related Art

Directly bonded structures for microelectronics typically include a carrier (such as a wafer or integrated device die) and one or more integrated device dies directly bonded to a bonding surface of the carrier without an intervening adhesive. The carrier often includes a semiconductor or dielectric bonding surface, and the integrated device die(s) includes a bonding surface of the same material. The respective bonding surfaces of the carrier and the die(s) can be processed for direct bonding and brought into contact to form direct bonds. In some devices, conductive contact pads of the carrier can be directly bonded to corresponding contact pads of the die(s) to form direct hybrid bonds. It can be challenging to integrate different types of materials into directly bonded structures. It can also be challenging to form multiple vertical levels at which devices are provided. Accordingly, there remains a continuing need for improved directly bonded structures.

SUMMARY OF EMBODIMENTS

For purposes of this summary, certain aspects, advantages, and novel features are described herein. It is to be understood that not necessarily all such advantages may be achieved in accordance with any particular embodiments. Thus, for example, those skilled in the art will recognize the disclosures herein may be embodied or carried out in a manner that achieves one or more advantages taught herein without necessarily achieving other advantages as may be taught or suggested herein.

All of the embodiments described herein are intended to be within the scope of the present disclosure. These and other embodiments will be readily apparent to those skilled in the art from the following detailed description, having reference to the attached figures. The embodiments described herein are not intended to limit the disclosure to any particular embodiment or embodiments.

In some embodiments, a method of forming a bonded structure comprises: forming a bonding surface in a first region of a first element; covering at least a portion of the bonding surface with a protective layer; processing in a second region of the first element to produce a second surface in the second region, wherein the second surface is materially different from the bonding surface; uncovering the bonding surface in the first region; and directly bonding a second element to the bonding surface in the first region.

In some embodiments, a method of forming a bonded structure comprises: preparing a bonding surface on a carrier for direct bonding; forming a buildup structure over a portion of the bonding surface; and after forming the buildup structure, directly bonding an element to an exposed portion of the bonding surface without an intervening adhesive.

In some embodiments, a method of forming a bonded structure comprises: preparing a bonding surface of a first region of a carrier for direct bonding; after preparing the bonding surface, providing a buildup structure in a second region of the carrier that is laterally spaced from the first region, the buildup structure extending vertically above the bonding surface in a direction non-parallel to the bonding surface, the buildup structure comprising one or more layers provided on the carrier; and after providing the buildup structure, directly bonding an element to the bonding surface of the first region of the carrier without an intervening adhesive. In some embodiments, the buildup structure may be disposed on a directly bonded die. For example, the buildup structure may comprise one or more of a back end of line (BEOL) layer on the die, with the BEOL layer comprising a passive element, an optical element, or a mechanical element, and so forth.

In some embodiments, a method of forming a bonded structure comprises: providing a carrier having a first region and a second region laterally spaced from the first region; providing an integrated circuit such as, for example, a microelectromechanical systems (MEMS) device, in the second region in a plurality of layers; and directly bonding an element to a bonding surface of the first region of the carrier without an intervening adhesive, the element shaped to at least partially define a cavity, the integrated circuit (e.g., the MEMS device) disposed in the cavity and extending above the bonding surface.

In some embodiments, a method of forming a bonded structure comprises: directly bonding a first bonding layer of a first device to a first nonconductive bonding region of a carrier without an intervening adhesive, the first nonconductive bonding region comprising a first nonconductive material; and directly bonding a second bonding layer of a second device to a second nonconductive bonding region of the carrier without an intervening adhesive, the second nonconductive bonding region comprising a second nonconductive material that has a different composition from the first nonconductive material.

In some embodiments, a method of forming a bonded structure comprises: providing a carrier having a first region and a second region laterally spaced from the first region; providing an integrated buildup structure in the second region of the carrier, the integrated buildup structure comprising one or more layers on the carrier; and directly bonding an element, such as, for example, an optical element, to a bonding surface of the first region without an intervening adhesive, the integrated buildup structure extending vertically above the bonding surface in a direction non-parallel to the bonding surface.

In some embodiments, a bonded structure comprises: a carrier having a first region and a second region laterally spaced from the first region; an element directly bonded to a bonding surface of the first region without an intervening adhesive; and an integrated buildup structure in the second region extending vertically above the bonding surface in a direction non-parallel to the bonding surface, the integrated buildup structure comprising one or more layers on the carrier. In some embodiments, the buildup structure can be disposed on a die that is mounted to the carrier.

In some embodiments, a bonded structure comprises: a carrier having a first region and a second region laterally spaced from the first region; an element directly bonded to a bonding surface of the first region of the carrier without an intervening adhesive, the element shaped to at least partially define a cavity; and an integrated microelectromechanical systems (MEMS) device disposed in the cavity and patterned onto the second region in a plurality of layers, the MEMS device extending above the bonding surface.

In some embodiments, a bonded structure comprises: a carrier having a first nonconductive bonding region and a second nonconductive bonding region, the first nonconductive bonding region comprising a first nonconductive material and the second nonconductive region comprising a second nonconductive material that has a different composition from the first nonconductive material; a first device having a first bonding layer directly bonded to the first nonconductive bonding region of the carrier without an intervening adhesive; and a second device having a second bonding layer directly bonded to the second nonconductive bonding region of the carrier without an intervening adhesive.

In some embodiments, a bonded structure comprises: a carrier having a first region and a second region laterally spaced from the first region; an optical element directly bonded to a bonding surface of the first region without an intervening adhesive; and an integrated buildup structure in the second region extending vertically above the bonding surface in a direction non-parallel to the bonding surface, the integrated buildup structure comprising one or more layers on the carrier.

In some embodiments, a bonded structure comprises: a carrier having a first region and a second region laterally spaced from the first region; an optical device die directly bonded to a bonding surface of the first region without an intervening adhesive; and an optical pathway disposed in the second region and optically coupled with the optical device die, the optical pathway having an optical port disposed vertically above the bonding surface in a direction non-parallel to the bonding surface, the optical port in optical communication with the optical device die.

In some embodiments, a bonded structure comprises: a carrier having a first nonconductive bonding region and a second region laterally spaced from the first region; an element directly bonded to a bonding surface of the first nonconductive bonding region without an intervening adhesive; the first nonconductive bonding region comprising a first nonconductive material; and an integrated buildup structure in the second region extending vertically above the bonding surface in a direction non-parallel to the bonding surface, the integrated buildup structure comprising one or more layers on the carrier including a second bonding layer and a second device directly bonded to the second nonconductive bonding region of the carrier without an intervening adhesive. In some embodiments, the second bonding layer comprises a nonconductive material that is similar to the first nonconductive material. In some embodiments, the second bonding layer comprises a nonconductive material that is different from the first nonconductive material.

BRIEF DESCRIPTION OF THE DRAWINGS

These and other features, aspects, and advantages of the disclosure are described with reference to drawings of certain embodiments, which are intended to illustrate, but not to limit, the present disclosure. It will be understood that the accompanying drawings, which are incorporated in and constitute a part of this specification, are for the purpose of illustrating concepts disclosed herein and may not be to scale.

DETAILED DESCRIPTION OF EMBODIMENTS

Although several embodiments, examples, and illustrations are disclosed below, it will be understood by those of ordinary skill in the art that the disclosures described herein extend beyond the specifically disclosed embodiments, examples, and illustrations and includes other uses and obvious modifications and equivalents thereof. Embodiments are described with reference to the accompanying figures, wherein like numerals refer to like elements throughout. The terminology used in the description presented herein is not intended to be interpreted in any limited or restrictive manner simply because it is being used in conjunction with a detailed description of certain specific embodiments of the inventions. In addition, embodiments of the inventions can comprise several novel features and no single feature is solely responsible for its desirable attributes or is essential to practicing the inventions herein described.

Various embodiments disclosed herein relate to directly bonded structures in which different elements can be bonded to different regions of a carrier. In some embodiments, a first element (e.g., a first integrated device die or other element) can be directly bonded to a bonding surface in a first region of a carrier. A second region of the carrier can be processed to produce a surface that is materially different from the bonding surface. For example, in some embodiments, the materially different surface can comprise a different material composition (e.g., a bonding layer with a different material composition).

In some embodiments, the materially different surface can comprise a surface at a different vertical elevation relative to the bonding surface. Conventionally, it is difficult to prepare surfaces at different elevations or of different materials for direct bonding due to the need to highly planarize and activate surfaces, which can be incompatible with post-preparation processing entailed by the different materials and/or elevations. The embodiments disclosed herein can beneficially enable the integration of different material sets, which can facilitate the use of direct bonding techniques for a variety of different devices. The embodiments disclosed herein can additionally or alternatively enable the integration of devices in three dimensions at vertically offset surfaces. For example, the embodiments disclosed herein can enable the removal of top layers to expose an underlying bond interface without resulting in surface roughness that is too great for direct bonding.

Figure 1:
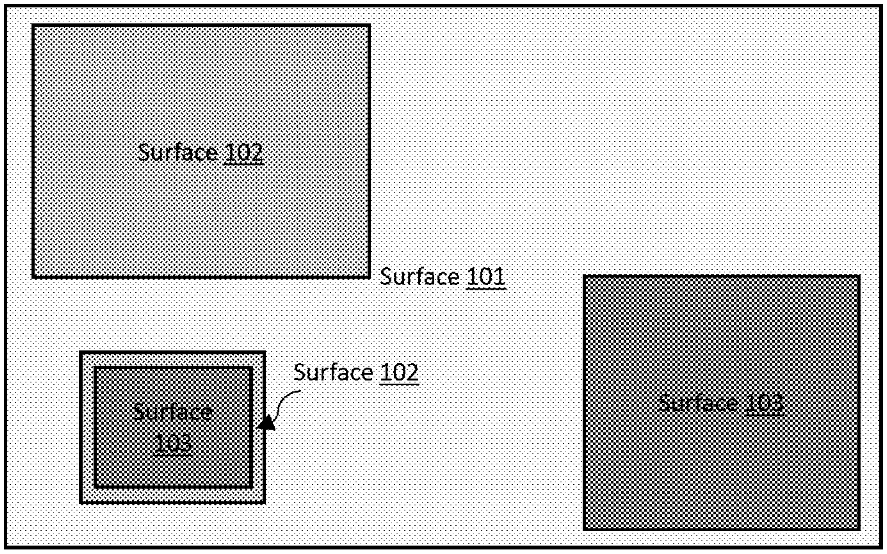
FIG. 1 is an illustration of a surface comprising different bonding regions according to some embodiments.

FIG. 1 is an illustration of a surface comprising different bonding regions according to some embodiments. As shown, in various embodiments, a first element comprising a carrier (such as a wafer, integrated device die, or other type of element) can include different regions. The different regions can comprise different bonding materials. For example, the carrier can include a first surface 101 of a first nonconductive material, a second surface 102 of a second nonconductive material, and a third surface 103 of a third nonconductive material. In some embodiments, the third surface 103 may be on top of the first surface 101, on top of the second surface 102, or embedded within the second surface 102. Similarly, the second surface 102 and the third surface 103 may be embedded in the first surface 101. The first, second, and third nonconductive materials may have different compositions. For example, in some embodiments, the first, second, and third non-conductive materials may comprise an undoped semiconductor (e.g., pure silicon), silicon nitride, silicon oxide, silicon oxynitride, silicon carbonitride, and/or a different dielectric material, which may be a low-k dielectric material.

Figure 2:
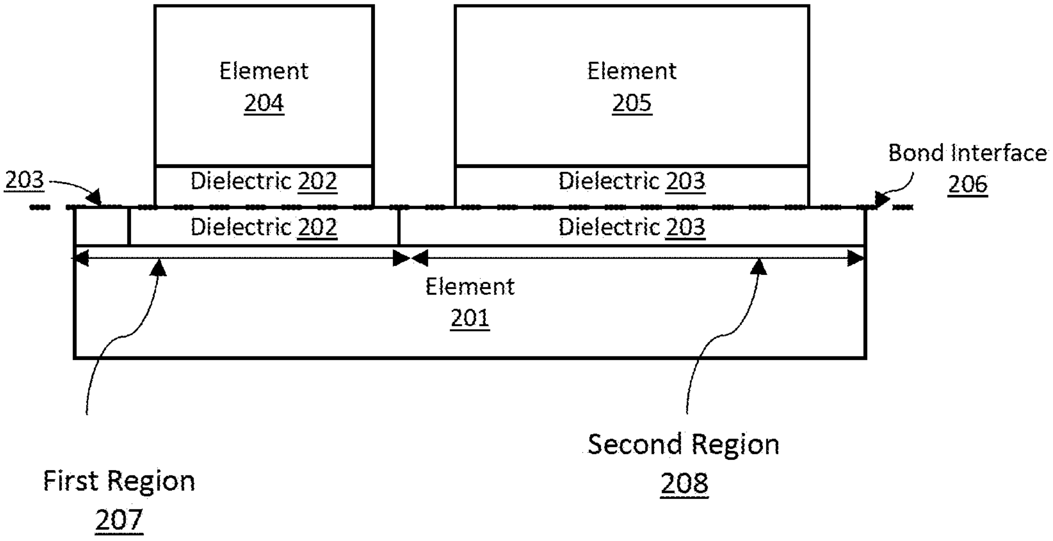
FIG. 2 is an illustration of direct bonding of multiple elements according to some embodiments.
Figure 3A:
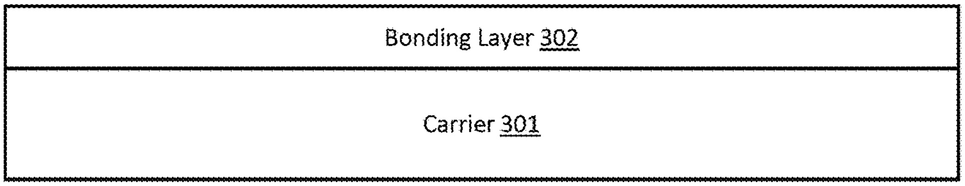
FIGS. 3A-3E illustrates an embodiment of two laterally-spaced bonding surfaces according to some embodiments.
Figure 3B:
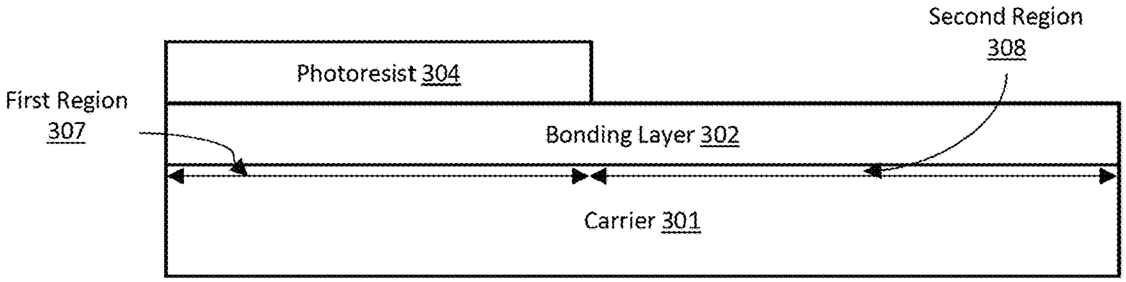
Figure 3C:
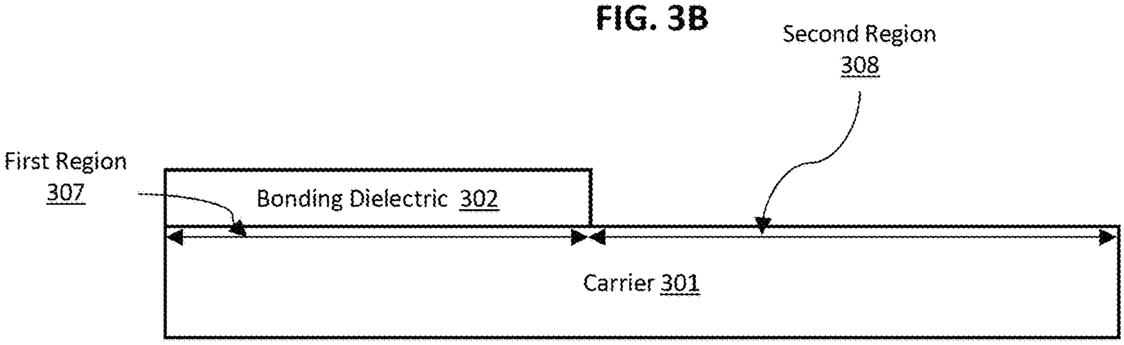
Figure 3D:
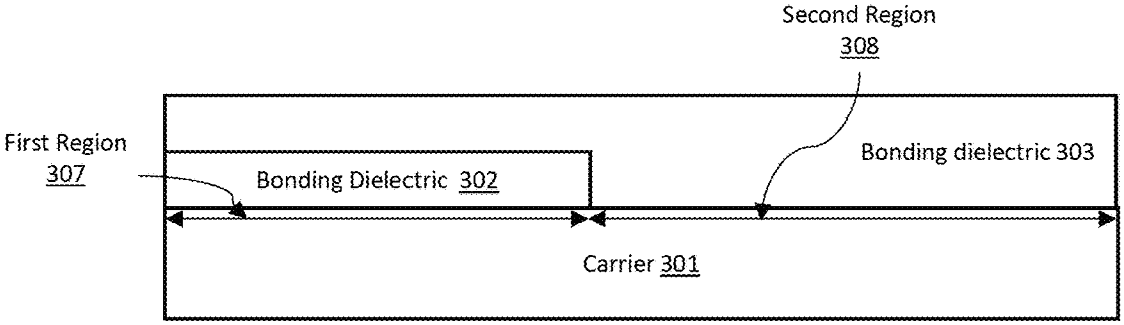
Figure 3E:
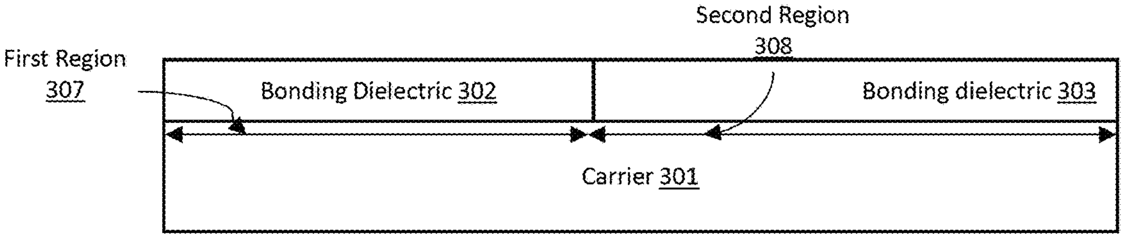

FIG. 2 illustrates an example bonded structure. In some embodiments, for example, the first element 201 may comprise a carrier (for example, a first die, wafer, or flat panel) including a first region 207 having a first dielectric material 202 (for example, silicon nitride) and a second region 208 having a second dielectric material 203 (for example, silicon oxide or a low K dielectric material). In some embodiments, a second element 204 (for example, a second die) can have a bonding layer comprising the first dielectric material 202. In other embodiments, the bonding layer of the second element 204 can comprise a material different from the first nonconductive material of the first region 207 of the carrier. Further, a third element 205 (for example, a third die) can have a bonding layer comprising the second dielectric material 203. In other embodiments, the bonding layer of the third element 205 can comprise a material different from the second nonconductive material of the second region 208 of the carrier, and may entail different preparation (e.g., activation) for direct bonding. The use of different nonconductive materials for direct bonding can be applied to any of the embodiments disclosed herein. In some embodiments, the first dielectric material 202 may be, for example, embedded in the first region 207 of the first element 201 (e.g., a carrier), and the second dielectric material 203 may be embedded in the second region 208 of the first element 201 (e.g., a carrier).

The first and second regions 207 and 208 can be formed in different process steps, in some embodiments. As explained herein, a bonding layer comprising the second dielectric material 203 (or alternatively, the first dielectric material 202) may be provided over the upper surface of the first element 201 (for example, the first die or the carrier). For example, in some embodiments, the second dielectric material 203 (or alternatively, the first dielectric material 202) may be provided over the entirety of the upper surface. A portion of the bonding layer comprising the first region 207 may be removed (for example, by a selective etching process), and the first dielectric material 202 may be provided within the first region 207 where the portion of the bonding layer was removed. The first and second regions 207 and 208 may be polished and/or planarized in the same step in some embodiments. In other embodiments, the first region 207 and the second region 208 may be polished and/or planarized in separate steps, such that one region is processed before the other. In some embodiments, both the first and second regions 207 and 208 may be activated and/or terminated with a suitable species, as explained below. In other embodiments, only one of the first and second regions 207 and 208 may be activated and/or terminated. In other embodiments, neither the first region 207 nor the second region 208 may be activated and/or terminated. In such embodiments, the element to which the first region 207 and/or second region 208 is to be directly bonded at bond interface 206 (for example, element 204 or element 205) can be activated and/or terminated. In some embodiments, the first dielectric material 202 and the second dielectric material 203 may be separated by a lateral gap (not shown). The lateral gap may comprise a dielectric material (for example, a spacer dielectric material) similar to the first element 201 or another suitable dielectric material. The bond interface 206 may comprise a first dielectric material 202, a second dielectric material 203, and the spacer dielectric material. In some embodiments, the first dielectric material 202 and/or the second dielectric material 203 may comprise a die directly bonded to the first element 201 (e.g., a carrier). In some embodiments, the backside of a bonded die may be thinned, planarized and a bonding surface formed on the backside of the thinned die.

An exemplary process flow is depicted in FIGS. 3A-3E. A bonding layer 302 is deposited on carrier 301. A photoresist layer 304 is deposited and patterned on top of the bonding layer 302 to expose an unprotected second region 308 of the bonding layer 302. The exposed bonding layer 302 is then removed (e.g., by etching), to create a cavity (e.g., second region 308) in the bonding layer 302. The remaining bonding layer 302 forms the first region 307. This is followed by the deposition of another bonding layer 303. In some embodiments, one or more dielectric layers (e.g., buffer layers, adhesion layers, diffusion barriers, and so forth) (not shown) may be deposited before bonding layer 303 is deposited. Bonding layer 303 may then be polished to first expose the bonding layer 302 in the first region 307. Both the bonding layers then may be polished, activated and prepared together for direct bonding. In some embodiments, the bonding layer 302 and the bonding layer 303 maybe laterally separated by a spacer dielectric material (not shown).

Figure 4A:
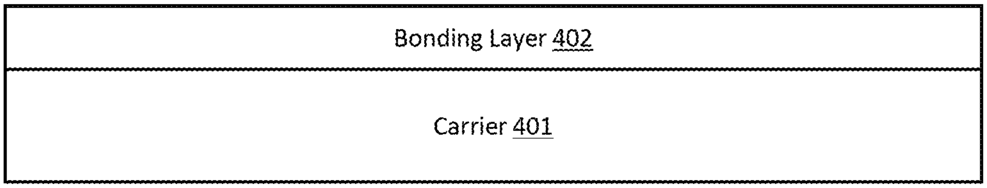
FIGS. 4A-4F illustrate a direct bonding process according to some embodiments.

FIGS. 4A-4F illustrate a method for forming a bonded structure according to one embodiment. As shown in FIG. 4A, a bonding layer 402 may be provided (e.g., deposited or transferred) on a carrier 401. The carrier 401 may comprise a semiconductor element such as a wafer, a die, a reconstituted wafer or element, etc. In the illustrated embodiment, the carrier 401 can comprise a first integrated device die or a device die region of a wafer. The bonding layer 402 can comprise a nonconductive material, such as a dielectric material (e.g., silicon oxide, silicon nitride, silicon oxynitride, silicon carbonitride, etc.). The bonding layer 402 can also include co-planar (or slightly recessed, e.g., less than 20 nm recessed) conductive surfaces. The bonding layer 402 can be prepared for direct bonding to form a bonding surface. As explained below, the bonding layer 402 can be polished and/or planarized to a high degree of smoothness. In some embodiments, the polished bonding layer 402 can be activated and/or terminated with a suitable species as explained below. In some embodiments, the entire surface of the carrier 401 can be prepared for direct bonding.

Figure 4B:
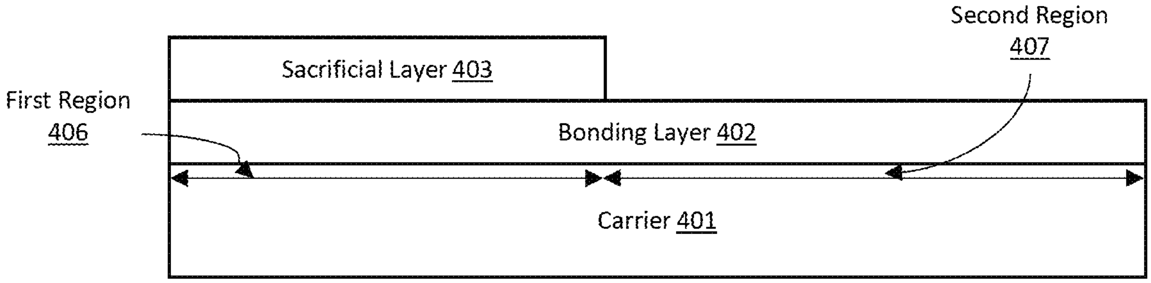

Turning to FIG. 4B, a protective sacrificial layer 403 can be deposited and patterned over a first region 406 of the carrier 401, e.g., over the portion of the bonding layer 402 in the first region 406. As shown, a second region 407 of the bonding layer 402 of the carrier may be exposed and uncovered by the patterned protective sacrificial layer 403. The protective sacrificial layer 403 can comprise any suitable material that is readily removable from the bonding layer 402. For example, in some embodiments, the sacrificial layer 403 can comprise a photoresist, a polyimide or polyamide material, or carbon (e.g., a thin carbon layer of about 100 nm or less), but other materials may be suitable. In some embodiments, the sacrificial layer may be an inorganic material such as, for example, silicon nitride or another dielectric, or any suitable etch stop layer. In some embodiments, the sacrificial layer may comprise multiple layers.

Figure 4C:
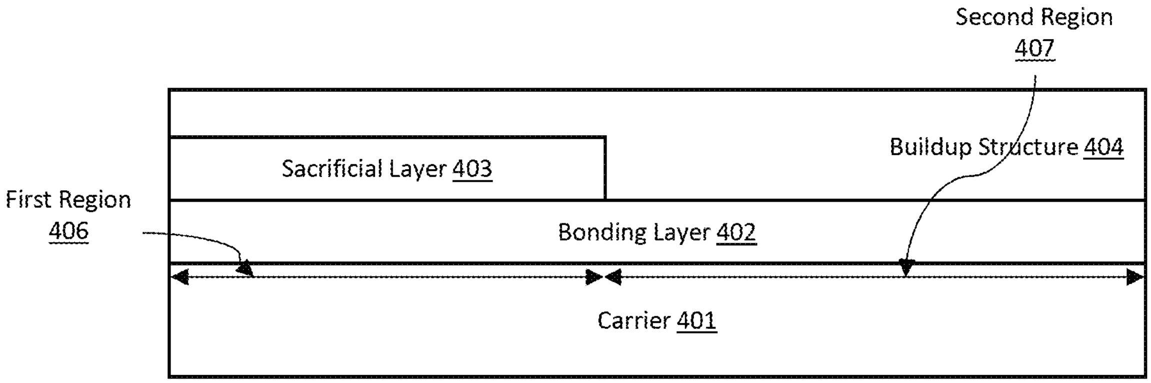

In FIG. 4C, an integrated buildup structure 404 can be provided at least on (e.g., directly on) the bonding layer 402 of the second region 407 of the carrier. In other embodiments (see FIG. 9), one or more intervening elements may be disposed on the carrier 401, and the buildup structure 404 can be provided directly on the intervening element(s). In the illustrated embodiment, the buildup structure 404 can comprise one or more layers that are deposited over the first region 406 and second region 407 of the carrier 401. As shown, the buildup structure 404 can be deposited on the second region 407 of the carrier 401 and also over the protective sacrificial layer 403 in the first region 406. In FIG. 4C, the buildup structure 404 can be planarized in the first region 406 and second region 407. In other embodiments, the buildup structure 404 may be provided on the second region 407 in a transfer process, followed by additional deposition over the first region 406 (or deposition over both the transferred structure and the first region 406, followed by planarization). For example, the buildup structure 404 can be formed on a handle wafer, directly bonded to the second region 407 without an adhesive, and the handle wafer removed. In some embodiments, the buildup structure 404 may be attached via flip chip interconnections to the second region 407 or using a die attach material.

The buildup structure 404 can comprise a multi-layer structure with multiple layers of insulating and conductive material. In some embodiments, the multi-layer structure can comprise an interconnect structure having traces and vias embedded in one or multiple insulating layers. The interconnect structure can be configured to transfer electrical signals laterally and/or vertically through the buildup structure 404. In some embodiments, the buildup structure 404 can comprise one or more integrated devices formed therein. For example, the one or more integrated devices can comprise a microelectromechanical systems (MEMS) device, integrated circuitry (e.g., transistors), an optical device, etc. In some embodiments, the buildup structure 404 may not comprise an integrated device die. For example, in some embodiments, the buildup structure 404 may not comprise a bulk semiconductor portion (e.g., a bulk silicon portion). Rather, in the illustrated embodiments, the buildup structure 404 can serve as an inorganic or laminate electrical interconnect that is formed on (e.g., deposited on) the second region 407 of the carrier 401, and/or an integrated device formed on (e.g., deposited on) the second region 407 of the carrier 401. In some embodiments, as noted above, the inorganic or laminate electrical interconnect can be provided on the second region 407 in a transfer or attachment process. The structure of FIG. 4C can be planarized in some embodiments. In some embodiments, the structure of FIG. 4C can additionally be prepared for direct bonding over the second region 407 and protected with another protective sacrificial layer.

Figure 4D:
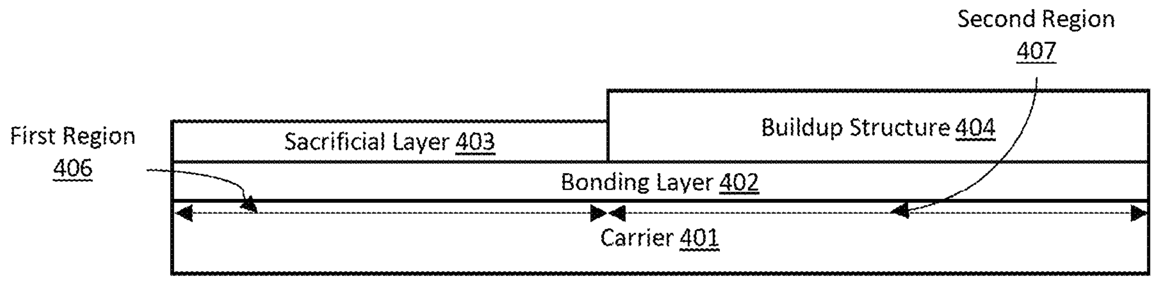

In FIG. 4D, the buildup structure 404 can be patterned so as to remove a portion of the buildup structure 404 that overlies the sacrificial layer 403 and the first region 406. In other embodiments, the buildup structure 404 can be placed only in the second region 407 (e.g., transferred to the second region 407) and may not overlie the first region 406 and sacrificial layer 403. In some embodiments, a portion of the buildup structure 404 that overlies the sacrificial layer 403 and the first region 406 may be removed by, for example, by grinding and polishing.

Figure 4E:
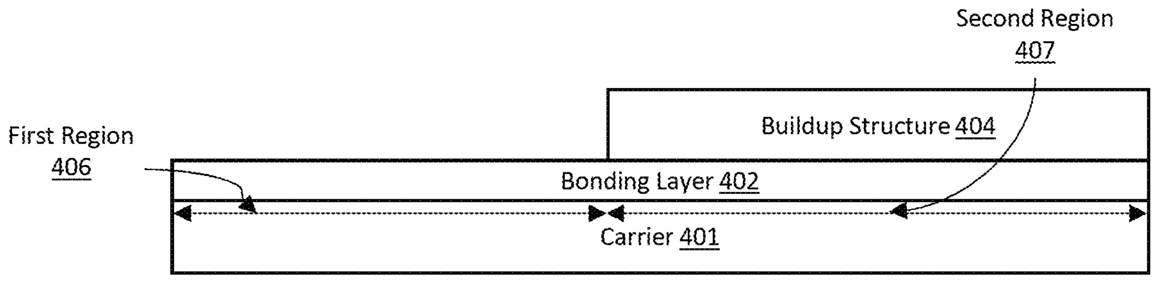

In FIG. 4E, the sacrificial layer 403 depicted in FIG. 4D may be removed in any suitable manner. Beneficially, the removal of the sacrificial layer 403 may not negatively affect surface roughness and suitability for direct bonding. For example, organic (e.g., photoresist) sacrificial materials can be removed by supplying (e.g., spraying) a developer solution to the sacrificial material or using an ashing process (e.g., oxygen plasma) to remove the sacrificial material without affecting the roughness of the underlying first region 406. In some embodiments, cleaning and activation of the first region 406 for direct bonding can be conducted at this stage, following removal of the sacrificial layer 403. In other embodiments, the deposition and removal of the sacrificial layer 403 do not disturb preparations for bonding made prior to the deposition of the sacrificial layer 403 in FIG. 4B.

Figure 4F:
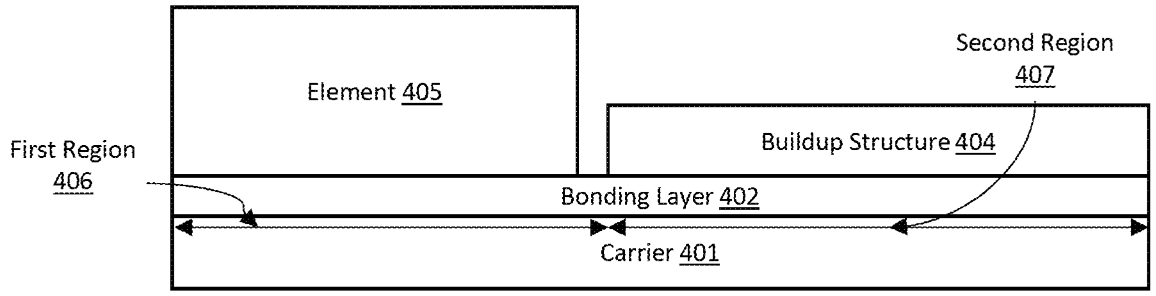

In FIG. 4F, an element 405 (e.g., an integrated device die) can be directly bonded to the bonding layer 402 of the first region 406 of the carrier 401. The element 405 can accordingly be directly bonded to the carrier 401 after forming the buildup structure 404. The buildup structure 404 can be built up vertically such that an upper surface of the buildup structure 404 is vertically above the bonding layer 402 to which the element 405 is directly bonded. As explained herein, in some embodiments, another element (e.g., another die, an optical device, a passive component, a dummy component, a dummy device, or any other microelectronic element) can be directly bonded to the upper surface of the buildup structure 404 without an adhesive (see, for example, FIG. 6), particularly if bonding preparation and protection were conducted at the stage of FIG. 4C. In some embodiments, another element can be bonded to the upper surface of the buildup structure 404 by any other suitable method, e.g., by using flip chip interconnections, laminate or die attach materials, etc.

Figure 5A:
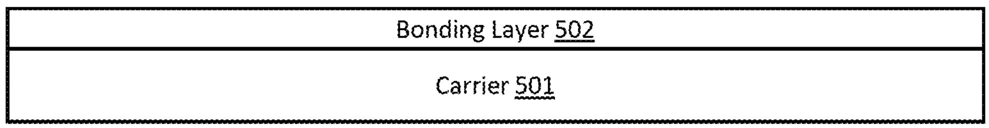
FIGS. 5A-5F illustrate a direct bonding process according to some embodiments.
Figure 5B:
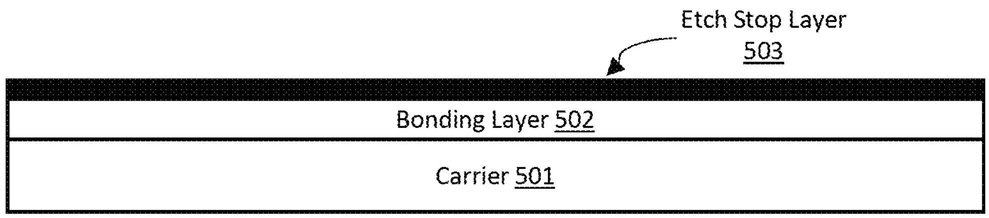

FIGS. 5A-5F illustrate a method of forming a bonded structure according to another embodiment. Unless otherwise noted, the steps and structures shown in FIGS. 5A-5F may be generally similar to or the same as those described above in FIGS. 4A-4F. Unlike in FIGS. 4A-4F, an etch stop layer 503 may be provided over the bonding surface of the carrier, as shown in FIG. 5B. The etch stop layer 503 can be deposited over the entirety of the carrier 501 in some embodiments, including in the first and second regions 506 and 507. Thus, the etch stop layer 503 can be a blanket layer that remains unpatterned at this stage of processing. The etch stop layer 503 material is selected to stop the etch of a subsequently formed overlying buildup structure 504 (see FIGS. 5B and 5C), which may also serve as a bonding layer over the second region 507 in some embodiments. Additionally, the etch stop layer 503 should be easily removable without etching or substantially changing the roughness of the underlying bonding surface of the bonding layer 502 in the first region 506. In some embodiments, the etch stop layer 503 can comprise a polysilicon layer or a highly resistive organic or carbon layer. In some embodiments, portion of the etch stop layer 503 over the second region 507 may be pattered with cavities, and the cavities may be selectively filled with a planar conductive material to form an electrical interconnect layer (not shown). In some embodiments, the conductive interconnect layer embedded in the etch stop layer 503 can be formed for electrical signals to communicate via the etch stop layer 503 and the bonding layer 502 and any subsequent structures formed the over the etch stop layer 503 of the second region 507.

Figure 5C:
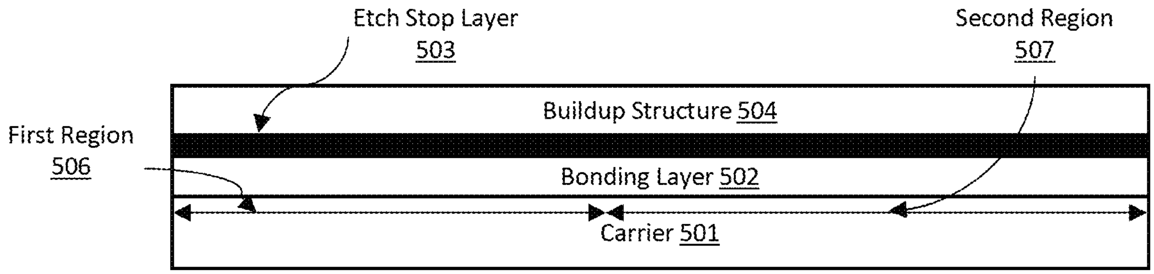

As with FIGS. 4A-4F, in FIG. 5C, a buildup structure 504 may be provided (e.g., deposited or transferred) on the etch stop layer 503. In the illustrated embodiment, the buildup structure 504 can be provided over the first region 506 and second region 507 of the carrier 501. Beneficially, the etch stop layer 503 can protect the underlying bonding surface of the bonding layer 502 during the processing that forms the buildup structure 504. The etch stop layer 503 may comprise, for example, a silicon nitride layer as at least an upper portion of the etch stop layer 503.

Figure 5D:
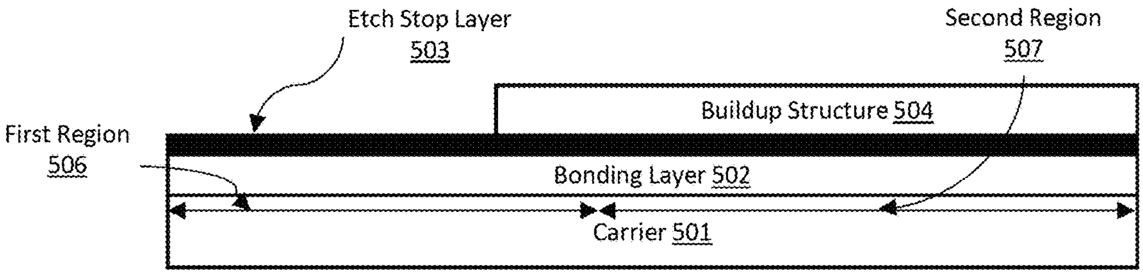

In FIG. 5D, the portion of the buildup structure 504 overlying the first region 506 can be removed. For example, the portion of the buildup structure 504 overlying the second region 507 can be masked, and the portion of the buildup structure 504 overlying the first region 506 can be etched. In some embodiments, the buildup structure may be formed overlying only the second region 507, for example by a transfer process such as direct bonding or by any other suitable process.

Figure 5E:
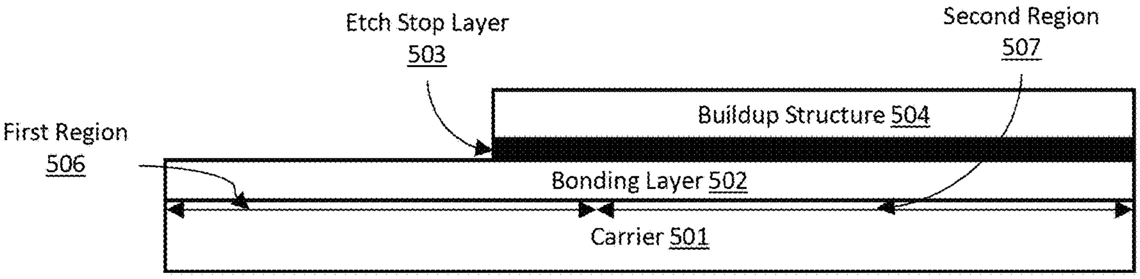

In FIG. 5E, the etch stop layer 503 can be selectively removed from the first region 506 without affecting the underlying bonding surface of the bonding layer 502. For example, the etch employed to remove the etch stop layer 503 from over a silicon oxide bonding layer can employ tetramethylammonium hydroxide (TMAH), which can have an etch selectivity of greater than about 1000:1 for etching silicon over silicon oxide. In other embodiments, for example, in which silicon nitride is used as the etch stop layer 503, the selectivity can be at least 10,000:1. In some embodiments, the etch stop layer 503 can comprise multiple layers such as, for example, silicon nitride over polysilicon. For example, a SiN/poly-Si bilayer etch stop layer can be etched using a first selective removal of SiN relative to Si (which need not be highly selective), followed by a highly selective removal of polysilicon relative to the underlying bonding layer in the first region 506. For example, as noted above, TMAH can remove polysilicon highly selectively relative to underlying silicon oxide. Similarly, a thin organic dielectric layer such as a polyimide etch stop layer can be etched using a first selective oxygen plasma to remove the organic layer relative to a dielectric bonding surface, for example, the underlying silicon oxide.

Figure 5F:
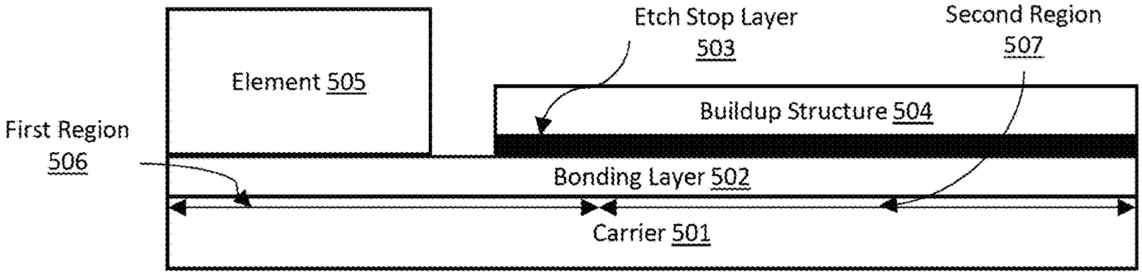

As shown in FIG. 5F, as above in FIG. 4F, an element 505 (e.g., a first die) can be directly bonded to the bonding surface of the bonding layer 502 in the first region 506 without an intervening adhesive. As also discussed above, if prepared and protected at the stage of FIG. 5C, direct bonding of a third element (not shown) can also be conducted over the buildup structure 504 in the second region 507.

Figure 6:
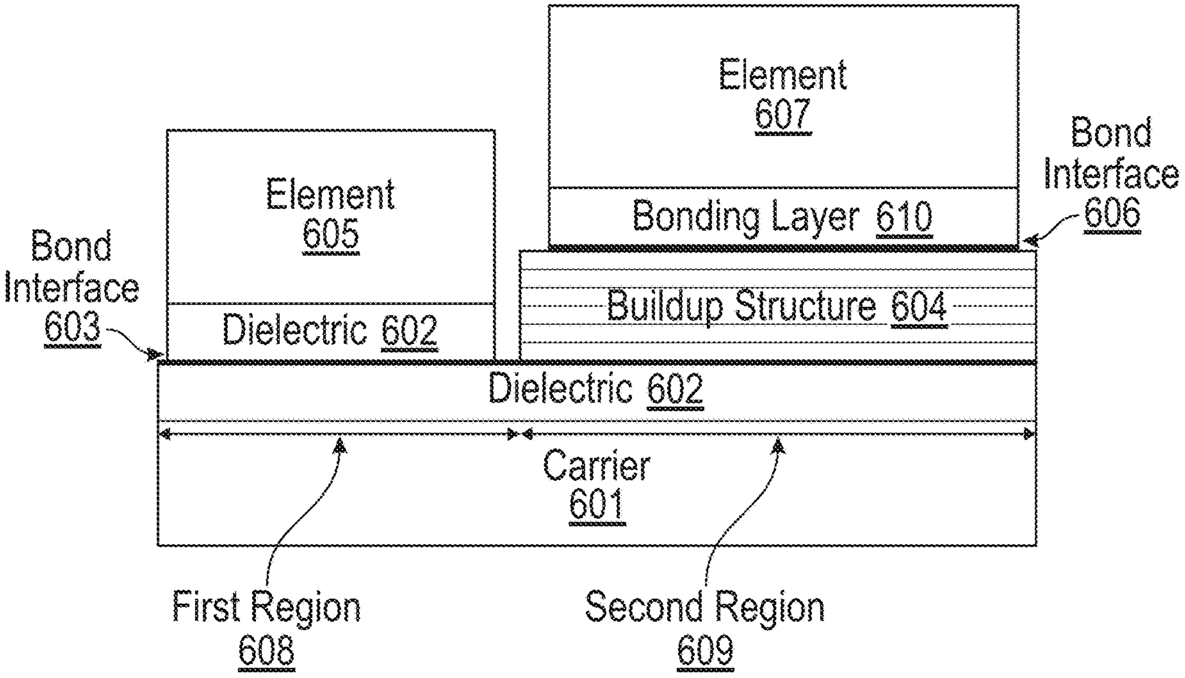
FIG. 6 is an illustration of direct bonding of multiple elements according to some embodiments.

The methods of FIGS. 4A-4F and 5A-5F can be used to form a bonded structure such as the structure shown in FIG. 6. In FIG. 6, a second element 607 (e.g., a second die, optical device, passive component, dummy device, dummy component, or any other microelectronic element) can be directly bonded via a bonding layer 610 to the upper surface of the buildup structure 604 disposed on a dielectric 602. In some embodiments, for example, the upper surface of the buildup structure shown in FIGS. 3C and 4C can be prepared for direct bonding (e.g., planarized) and, in some embodiments, activated and/or terminated. The prepared surface of the buildup structure in the second region 609 can also be protected (e.g., by a second sacrificial layer or etch stop layer) during additional processing, such as the removal of a sacrificial or etch stop layer from the first region 608 and/or bonding of the first element 605 (e.g., a first die) to the carrier 601 by way of the dielectric 602. The second protective sacrificial or etch stop layer may be removed from the buildup structure 604 in the second region 609 before mounting the second element 607. The second element 607 can be directly bonded to the upper surface of the buildup structure 604 via a bonding layer 610, and other portions of the additional layers may be removed. In various embodiments, the substrate or carrier 601 may comprise additional bonding interfaces, e.g., more than 2, more than 3, more than 4, or more than 6 bonding interfaces in corresponding vertical levels. In various embodiments, there may be, for example, up to 6 or more bonding interfaces in corresponding vertical levels. The first bonding interface 603 may be disposed vertically below, and laterally offset from, the second bonding interface 606. The materials at the first bond interface 603 may be the same as the materials at the second bonding interface 606, or may be different from the materials at the second bonding interface 606. The second bonding interface 606 may be disposed vertically below, and laterally offset from, a third bonding interface and may be, for example, a non-conductive direct bond, or a hybrid direct bond including directly bonded non-conductive and conductive regions. The third bonding interface may be disposed vertically below, and laterally offset from, a fourth bonding interface, and so forth. In some embodiments, a second element 607 (e.g., a second die, optical device, passive component, dummy device, dummy component, or any other microelectronic element) can be bonded to the upper surface of the buildup structure 604 disposed on a dielectric 602 by any other suitable method (e.g., by using flip chip interconnections, laminate or die attach materials, and so forth).

Figure 7A:
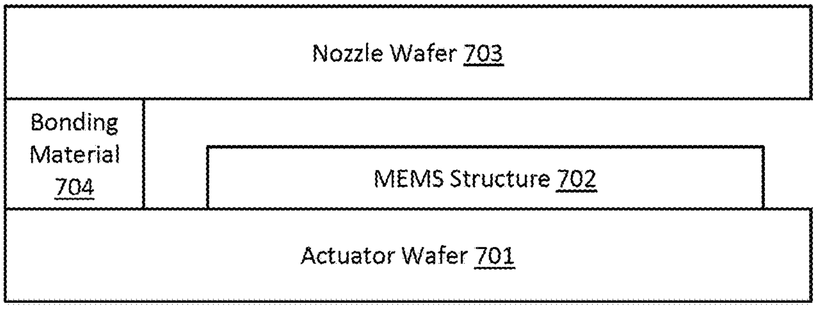
FIGS. 7A-7B are illustrations of MEMS devices formed according to some embodiments.

Various types of devices can be formed with the methods disclosed herein. FIG. 7A illustrates an example MEMS device that is not made according to the methods disclosed herein. In FIG. 7A, a MEMS structure 702 comprising a piezoelectric structure is configured to impart pressure to a chamber in response to an application of a voltage thereto. For example, the MEMS structure 702 can be used to drive a fluid (e.g., ink) out of an ink cartridge in response to a signal or voltage transferred to the piezoelectric material. In FIG. 7A, the device can be formed on an actuator wafer 701 by building up a plurality of layers, forming a membrane surface and a piezo that protrudes above the membrane surface (e.g., about 2 μm to about 10 μm). After building up the plurality of layers, a nozzle wafer 703 can be attached to an upper surface of a portion of the layers using a bonding material 704. In some embodiments, the bonding material 704 may be, for example, an organic adhesive. The adhesive may react with the fluid in the chamber and may also be temperature sensitive. For example, an adhesive may degrade at temperatures above about 80 degrees Celsius. In some embodiments, an oxide may be deposited instead of using an adhesive, but a thick oxide may present planarization and patterning problems.

Figure 7B:
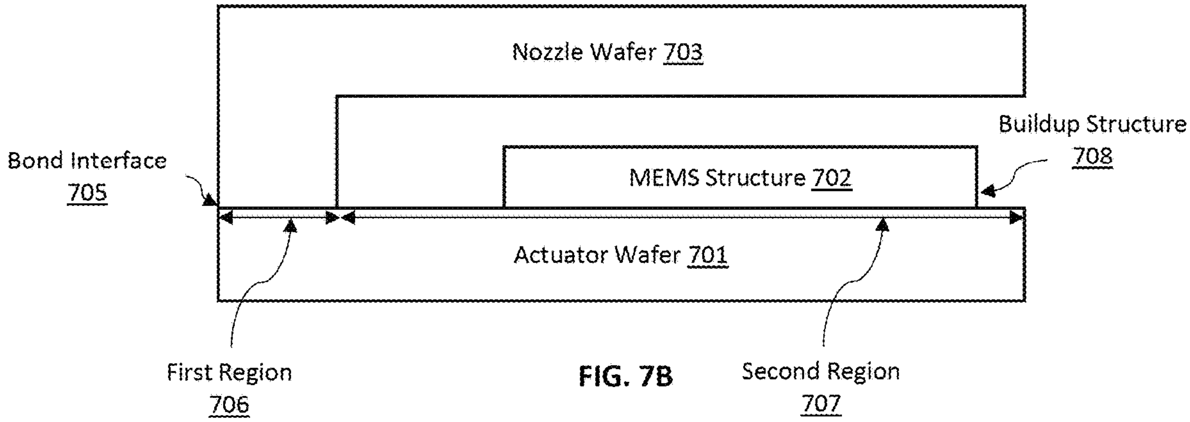

FIG. 7B illustrates an embodiment of a MEMS device that is similar to that shown in FIG. 7A, except the device can be formed using the methods disclosed herein, for example in FIGS. 4A-4F and FIGS. 5A-5F. For example, as explained above, a first region 706 of the actuator wafer 701 can be prepared for direct bonding by forming a bond interface 705.

In some embodiments, a patterned sacrificial material can be applied over the first region 706. In other embodiments, a blanket etch stop layer (not shown) can be deposited on the bonding surface of the actuator wafer 701. As explained above, a buildup structure 708 can be deposited in a second region 706 of the actuator wafer 701 and can be patterned to form the MEMS structure 702 (e.g., a piezoelectric device). The MEMS structure 702 can comprise an integrated MEMS device deposited on the bonding surface of the second region 707. The protective layer (sacrificial or etch stop layer) can be removed from the first region 706 after processing of the MEMS structure 702 in the second region 707. A mounting portion of an element (e.g., a nozzle wafer 703) can be directly bonded to the first region 706 of the actuator wafer 701 without an adhesive to define a cavity, with the MEMS structure 702 disposed in the cavity. While FIG. 7B illustrates an embodiment of a MEMS device, it will be appreciated that the MEMS structure 702 could be another buildup material, another die, an optical device, a passive component, a dummy device, or any other microelectronic element.

Beneficially, the embodiment of FIG. 7B can form a more secure and reliable bond between the nozzle wafer 703 and the actuator wafer 701. Unlike the device shown in FIG. 7A, the bonded structure shown in FIG. 7B may be less sensitive to high temperatures, may provide a lower vertical profile (due to the lack of intervening adhesive), may provide for hermetic sealing, and/or may be less reactive with the fluid to be provided in the cavity. Hybrid direct bonding can also facilitate electrical connections between the bonded elements. Moreover, as explained above, different material compositions may be used.

As another example, the embodiments disclosed herein can be used to form various types of optical and/or optoelectronic devices or systems. In optical and/or optoelectronic devices, multiple elements (including different types of elements) may be mounted at different vertical elevations within a package or system. For example, in some embodiments, a sensor or emitter die can be mounted at a first elevation, and a different die (such as a processor chip) can be mounted at a second elevation different from the first elevation. It can be challenging to directly bond the elements to one or more carriers at different elevations due to challenges associated with wafer-level processing for direct bonding. Various embodiments disclosed herein can enable the direct bonding of multiple different elements at different elevations. For example, in various embodiments, an optical or optoelectronic device die can be directly bonded at a first elevation, and another device (e.g., a processor chip, an optical device or die, etc.) can be directly bonded at another elevation.

Figure 8A:
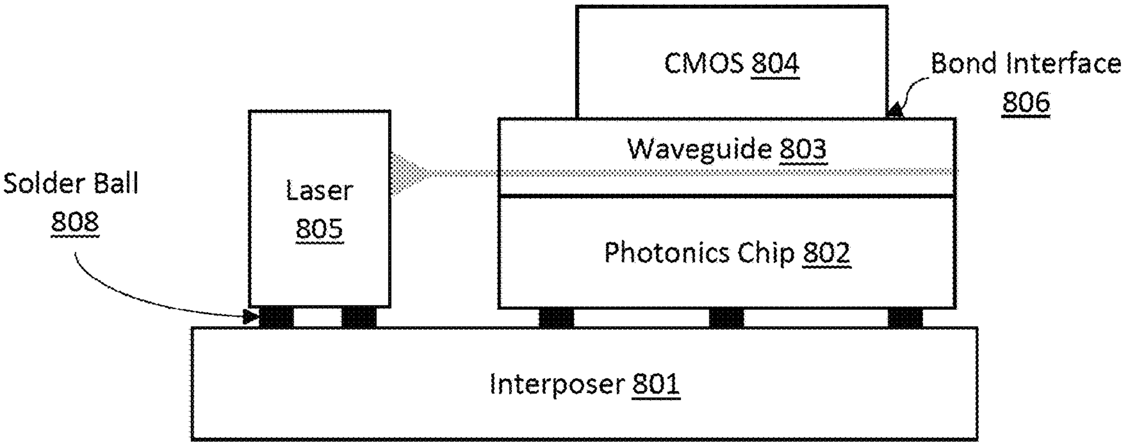
FIGS. 8A-8C are illustrations of optical packages formed according to some embodiments.

FIG. 8A is a schematic side view of an optical package comprising a photonics-based supercomputing chip. A photonics chip 802 can be mounted to an interposer 801 by way of solder balls 808. The solder balls can electrically connect pads on the interposer 801 to pads on the photonics chip 802. A waveguide 803 can be mounted to or formed on the photonics chip 802. A processor die such as CMOS chip 804 can be mounted to the waveguide 803 via bond interface 806. In some arrangements, the CMOS chip 804 can be directly bonded to the waveguide 803. In some arrangements, the CMOS chip 804 can be mounted to the photonics chip 802 by way of solder balls. An optical device such as a side-emitting laser device die 805 can be mounted on the interposer 801 by way of a flip chip connection (e.g., mounted to the interposer 801 by way of solder balls). The laser device die 805 can emit light from a side surface to couple into the waveguide 803. The CMOS chip 804 can process or otherwise interact with optical signals transmitted along the waveguide 803.

In order to effectively couple light to the waveguide 803, the laser device die 805 should be aligned vertically to the waveguide 803 to a very high accuracy. However, it can be challenging to accurately align the laser device die 805 vertically with the waveguide 803 in the arrangement of FIG. 8A, because, for example, the soldering process used to mount the laser device die 805 to the interposer 801 and to mount the photonics chip 802 to the interposer 801 does not have good volume control. Furthermore, the laser device die 805 may generate a significant amount of heat, and the solder balls may provide a poor thermal dissipation pathway to reduce the temperature of the laser device die 805. Moreover, as shown in FIG. 8A, the device utilizes an additional interposer 801, which increases costs and complexity of manufacturing.

Figure 8B:
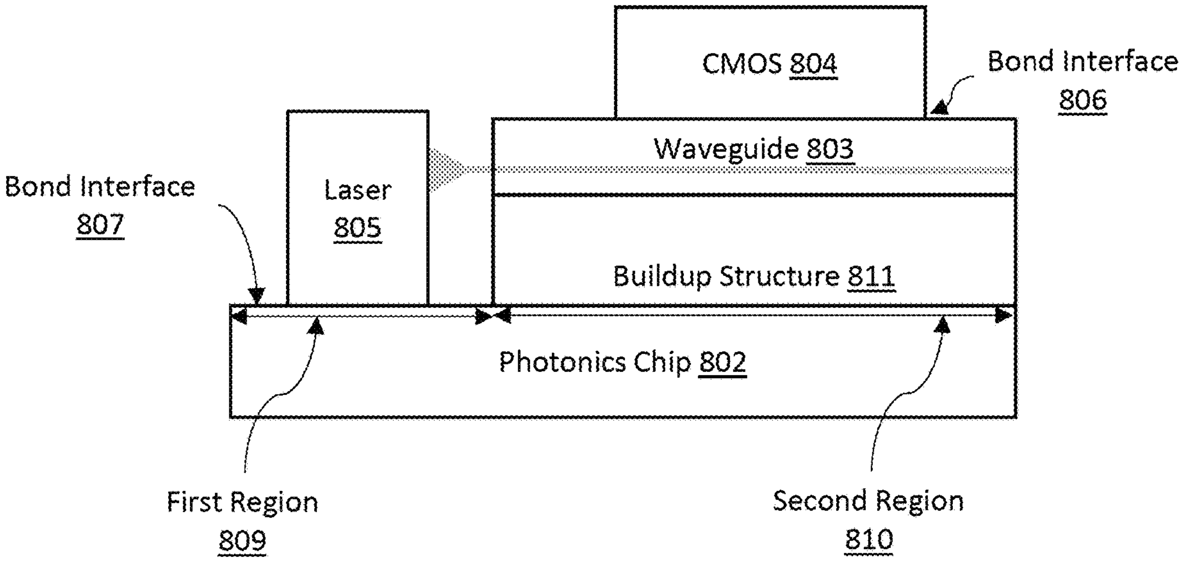

FIG. 8B illustrates an optical device according to another embodiment that may be manufactured using the methods disclosed herein. In FIG. 8B, an interposer need not be used. Rather, the CMOS chip 804 may be directly mounted to the waveguide 803 via bond interface 806, and the laser device die 805 can be mounted on the photonics chip 802 via bond interface 807. As explained above, a first region 809 of the photonics chip 802 or wafer can be prepared for direct bonding. In some embodiments, a protective sacrificial material can be applied over a first region 809. In other embodiments, an etch stop layer can be deposited on a bonding surface. As explained above, a buildup structure 811 can be formed in a second region 810 of the photonics chip 802 or wafer. The buildup structure can be patterned with electrical interconnects as explained herein and can be removed from the first region 809. The CMOS chip 804 can be mounted (e.g., directly bonded) to an optical pathway (e.g., the waveguide 803) in the second region 810 of the photonics chip 802 or wafer. The optical pathway (e.g., the waveguide 803) can comprise an optical port (e.g., an input or output optical coupling) configured to optically couple to the laser device die 805. In some embodiments, the waveguide 803 can be mounted or attached to the buildup structure 811. In other embodiments, the waveguide 803 can be built up on top of the buildup structure 811 so as to form a larger buildup structure onto which the CMOS chip 804 can be mounted. After forming the buildup structure, the laser device die 805 can be directly bonded to the first region 809 of the photonics chip 802 or wafer without an intervening adhesive.

Figure 8C:
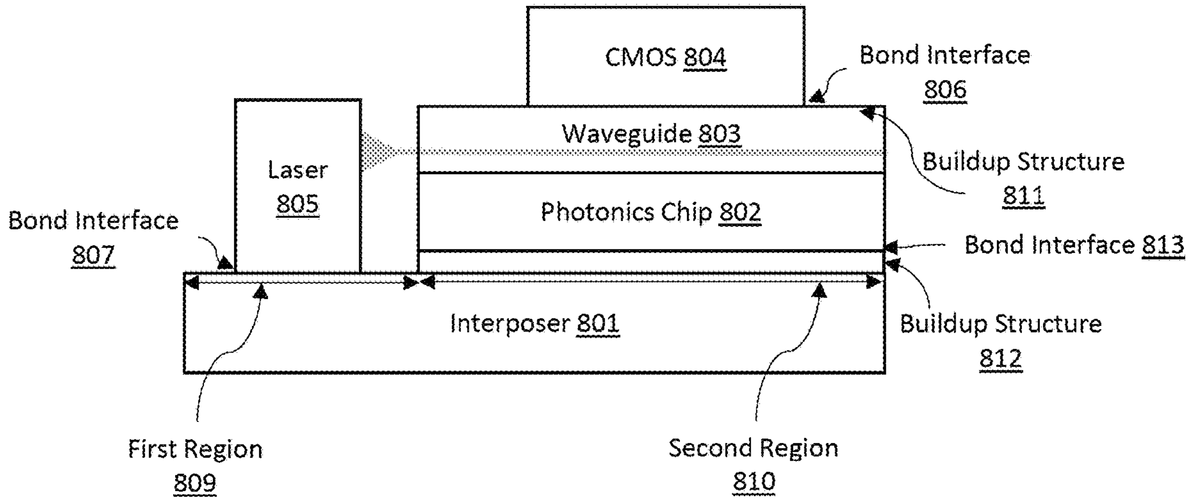

FIG. 8C illustrates an optical device according to another embodiment that may be manufactured according to the methods disclosed herein. In FIG. 8C, a laser device die 805 may be mounted on an interposer 801 via bond interface 807 within a first region 809. A buildup structure 812 formed on top of the interposer 801 in a second region 810 may have a bond interface 813 to which a photonics chip 802 is mounted (e.g., directly bonded or bonded with an adhesive). A waveguide 803 may be mounted (e.g., directly bonded) on top of the photonics chip 802, and a CMOS chip 804 can be mounted (e.g., directly bonded) to the waveguide 803.

Beneficially, the embodiments shown in FIGS. 8B and 8C can provide improved vertical alignment between the laser device die 805 and the waveguide 803. Because the use of solder is avoided, the height of the emission region of the laser device die 805 relative to the waveguide 803 can be tightly controlled based on the thickness of the laser device die 805 and any bonding layers formed thereon. Furthermore, directly bonding the laser device die 805 to the photonics chip 802 can improve heat dissipation. In some embodiments, the laser device die 805 can be hybrid bonded to the photonics chip 802 to form dielectric and conductive direct bonds. The conductive direct bonds can provide an efficient heat transfer pathway to dissipate heat from the optical device die.

Although the embodiments shown in FIGS. 8A-8C include an optical device die comprising an emitter device that includes a laser device, it should be appreciated that other types of optical emitter devices can be used in the disclosed embodiment. Furthermore, in some embodiments, the optical device die can comprise a different type of device die, such as a sensor die or other type of optical die.

Figure 9:
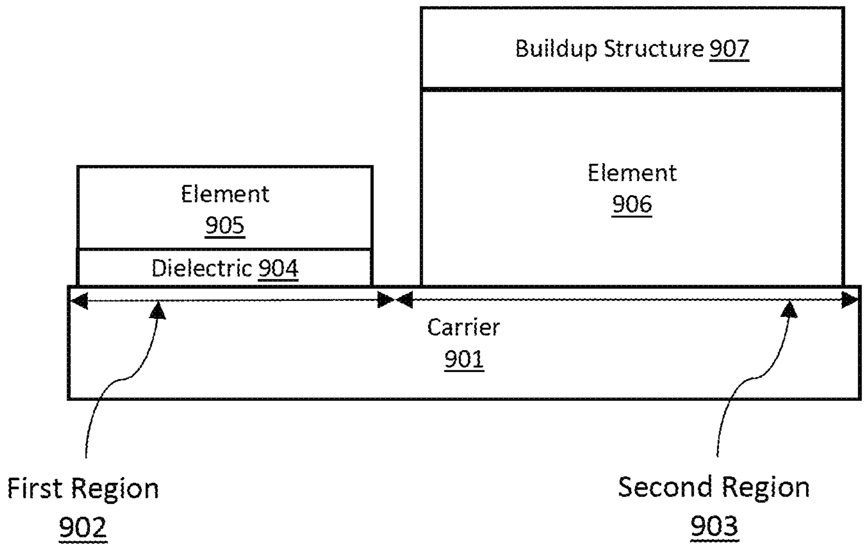
FIG. 9 is an illustration of bonding multiple elements according to some embodiments.

FIG. 9 illustrates bonding multiple elements to a carrier according to some embodiments. In FIG. 9, a carrier 901 has a first region 902 and a second region 903. In the first region 902, a dielectric bonding layer 904 of a first element 905 is directly bonded to the carrier 901. In the second region 903, a second element 906 is mounted to the carrier 901. The second element 906 may be mounted to the carrier 901 by soldering, direct bonding, using an adhesive, or the like. A buildup structure 907 may be formed on top of the second element 906, for example by wafer-level processing (e.g., deposition), a transfer process, etc. Thus, in some embodiments, the element 906 may intervene between the buildup structure 907 and the element 906.

Examples of Direct Bonding Methods and Directly Bonded Structures

Various embodiments disclosed herein relate to directly bonded structures in which two elements (e.g., a die, carrier, etc.) can be directly bonded to one another without an intervening adhesive. Two or more elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure.

In some embodiments, the elements are directly bonded to one another without an adhesive. In various embodiments, a non-conductive or dielectric material of a first element can be directly bonded to a corresponding non-conductive or dielectric field region of a second element without an adhesive. The non-conductive material can be referred to as a nonconductive bonding region or bonding layer of the first element. In some embodiments, the non-conductive material of the first element can be directly bonded to the corresponding non-conductive material of the second element using nonconductive direct bonding techniques. For example, nonconductive direct bonds may be formed without an adhesive using the direct bonding techniques disclosed at least in U.S. Pat. Nos. 9,564,414, 9,391,143, and 10,434,749, the entire contents of each of which are incorporated by reference herein in their entirety and for all purposes.

In various embodiments, direct hybrid bonds can be formed without an intervening adhesive. For example, nonconductive bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide one or more additional chemical species at the bonding surface that improve the bonding energy during direct bonding. In some embodiments, the activation and termination may be provided in the same step. For example, a plasma or wet etchant may activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the contents of each of which are incorporated by reference herein in their entirety and for all purposes.

In various embodiments, conductive contact pads of the first element can also be directly bonded to corresponding conductive contact pads of the second element. For example, a hybrid bonding technique can be used to provide conductor-to-conductor direct bonds along a bond interface that includes covalently directly bonded dielectric-to-dielectric surfaces, prepared as described above. In various embodiments, the conductor-to-conductor (e.g., contact pad to contact pad) direct bonds and the nonconductor-to-nonconductor hybrid bonds can be formed using the direct bonding techniques disclosed at least in U.S. Pat. Nos. 9,716,033 and 9,852,988, the contents of each of which are incorporated by reference herein in their entirety and for all purposes.

In some embodiments, nonconductive (e.g., semiconductor or dielectric) bonding surfaces can be prepared and directly bonded to one another without an intervening adhesive as explained above. Conductive contact pads (which may be surrounded by nonconductive field regions) may also directly bond to one another without an intervening adhesive. In some embodiments, the respective contact pads may be recessed below exterior (e.g., upper) surfaces of the dielectric field or nonconductive bonding regions. For example, the contact pads may be recessed by less than 20 nm, less than 15 nm, or less than 10 nm, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads may thermally expand and contact one another to form a metal-to-metal direct bond. Beneficially, the use of Direct Bond Interconnect, or DBI®, techniques commercially available from Xperi of San Jose, CA, can enable a high density of pads to be connected across the direct bond interface (e.g., small or fine pitches for regular arrays). In some embodiments, the pitch of the bonding pads may be less than 40 microns or less than 10 microns or even less than 2 microns. For some applications, the ratio of the pitch of the bonding pads to one of the dimensions of the bonding pads is less than 5, less than 3, or sometimes desirably less than 2. In various embodiments, the contact pads may comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. The first and second elements can accordingly comprise non-deposited elements. Directly bonded structures can include a defect region along the bond interface in which nanovoids are present. The nanovoids may be formed due to activation of the bonding surfaces (e.g., exposure to a plasma). As explained above, the bond interface may include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include, for example, copper). In other embodiments, however, there may be no barrier layer under the contact pads, for example, as described in US 2019/0096741, which is incorporated by reference herein in its entirety and for all purposes.

In one embodiment, a method of forming a bonded structure is disclosed. The method can include forming a bonding surface in a first region of a first element; covering at least a portion of the bonding surface with a protective sacrificial layer; processing in a second region of the first element to produce a second surface in the second region, wherein the second surface is materially different from the bonding surface; uncovering the bonding surface in the first region; and directly bonding a second element to the bonding surface in the first region.

In some embodiments, processing in the second region comprises building up layers in the second region such that the second surface is materially different from the bonding surface by being at, at least, a different elevation. In some embodiments, building up layers comprises depositing the layers which may be, for example, one or more of a nonconductive, conductive, organic, or inorganic material in the second region. In some embodiments, processing in the second region comprises forming a surface having a different composition from the bonding surface. In some embodiments, the method includes directly bonding a third element on the second surface without an adhesive. In some embodiments, the protective sacrificial layer comprises an inorganic etch stop material in the first and second regions. In some embodiments, the protective sacrificial layer may comprise a patterned sacrificial material in the first region and not in the second region.

In another embodiment, a method of forming a bonded structure is disclosed. The method can include preparing a bonding surface on a carrier for direct bonding; forming a buildup structure over a portion of the bonding surface; and after forming the buildup structure, directly bonding an element to an exposed portion of the bonding surface without an intervening adhesive.

In some embodiments, forming the buildup structure comprises depositing the buildup structure over a portion of the bonding surface. In some embodiments, the method includes covering the bonding surface with a protective sacrificial layer before forming the buildup structure. In some embodiments, covering the bonding surface comprises providing an etch stop material in the first and second regions over the bonding surface. In some embodiments, covering the bonding surface comprises providing a patterned sacrificial material in the first region of the bonding surface to which the element is to be directly bonded and not in the second region of the bonding surface. In some embodiments, the method includes preparing a second bonding surface on an upper surface of the buildup structure. In some embodiments, the method includes directly bonding a second element to the second bonding surface without an intervening adhesive. In some embodiments, the integrated buildup structure comprises an integrated device having one layer or a plurality of layers.

In another embodiment, a bonded structure is disclosed. The bonded structure can include a carrier having a first region and a second region laterally spaced from the first device region; an element directly bonded to a bonding surface of the first region without an intervening adhesive; and an integrated buildup structure in the second region extending vertically above the bonding surface in a direction non-parallel to the bonding surface, the integrated buildup structure comprising one layer or a plurality of layers on the carrier.

In some embodiments, the one or the plurality of layers are deposited onto the carrier. In some embodiments, the one or the plurality of layers are transferred onto the carrier from a second carrier. In some embodiments, the bonded structure includes a second element directly bonded to a second bonding surface of the integrated buildup structure without an intervening adhesive. In some embodiments, the one or the plurality of layers comprises an integrated device.

In another embodiment, a method of forming a bonded structure is disclosed. The method can include preparing a bonding surface of a first region of a carrier for direct bonding; after preparing the bonding surface, providing a buildup structure in a second region of the carrier that is laterally spaced from the first region, the buildup structure extending vertically above the bonding surface in a direction non-parallel to the bonding surface, the buildup structure comprising one layer or a plurality of layers provided on the carrier; and after providing the buildup structure, directly bonding an element to the bonding surface of the first region of the carrier without an intervening adhesive.

In some embodiments, providing the buildup structure comprises depositing the buildup structure on the second region of the carrier. In some embodiments, the method includes covering at least a portion of the bonding surface with a protective sacrificial layer before providing the buildup structure. In some embodiments, covering the bonding surface comprises providing an etch stop material in the first and second regions over the bonding surface. In some embodiments, covering the bonding surface comprises providing a patterned sacrificial material in the first region and not in the second region. In some embodiments, the method includes uncovering the bonding surface in the first region before the direct bonding. In some embodiments, the method includes preparing a second bonding surface of the buildup structure for direct bonding and directly bonding a second element to the second bonding surface without an intervening adhesive. In some embodiments, the buildup structure comprises an integrated device having one layer or a plurality of layers.

In another embodiment, a bonded structure is disclosed. The bonded structure can include a carrier having a first nonconductive bonding region and a second nonconductive bonding region, the first nonconductive bonding region comprising a first nonconductive material and the second nonconductive region comprising a second nonconductive material that has a different composition from the first nonconductive material; a first device having a first bonding layer directly bonded to the first nonconductive bonding region of the carrier without an intervening adhesive; and a second device having a second bonding layer directly bonded to the second nonconductive bonding region of the carrier without an intervening adhesive. In some embodiments, the first and second devices may be directly bonded to the carrier at different elevations.

In another embodiment, a method of forming a bonded structure is disclosed. The method can include directly bonding a first bonding layer of a first device to a first nonconductive bonding region of a carrier without an intervening adhesive, the first nonconductive bonding region comprising a first nonconductive material; and directly bonding a second bonding layer of a second device to a second nonconductive bonding region of the carrier without an intervening adhesive, the second nonconductive bonding region comprising a second nonconductive material that has a different composition from the first nonconductive material. In some embodiments, the method can include directly bonding the first device to a first bonding surface of the carrier and directly bonding the second device to a second bonding layer of the carrier, the first and second bonding layers disposed at different elevations.

In another embodiment, a bonded structure is disclosed. The bonded structure can include a carrier having a first region and a second region laterally spaced from the first region; an element directly bonded to a bonding surface of the first region of the carrier without an intervening adhesive, the element shaped to at least partially define a cavity; and an integrated microelectromechanical systems (MEMS) device disposed in the cavity and patterned onto the second region in a plurality of layers, the MEMS device extending above the bonding surface.

In some embodiments, the MEMS device comprises a piezoelectric material layer on the carrier, the piezoelectric material layer configured to impart pressure to the chamber in response to an application of a voltage thereto. In some embodiments, the bonded structure includes a fluid in the cavity. In some embodiments, the plurality of layers may be deposited onto the carrier. In some embodiments, the MEMS device may be disposed on, but not directly bonded to, the bonding surface.

In another embodiment, a method of forming a bonded structure is disclosed. The method can include providing a carrier having a first region and a second region laterally spaced from the first region; providing an integrated microelectromechanical systems (MEMS) device in the second region in a plurality of layers; and directly bonding an element to a bonding surface of the first region of the carrier without an intervening adhesive, the element shaped to at least partially define a cavity, the MEMS device disposed in the cavity and extending above the bonding surface.

In some embodiments, the method includes planarizing the bonding surface. In some embodiments, the method includes covering at least a portion of the bonding surface with a protective sacrificial layer before patterning the MEMS device. In some embodiments, covering the bonding surface comprises providing an etch stop material in the first and second regions over the bonding surface. In some embodiments, covering the bonding surface comprises providing a patterned sacrificial material in the first region and not in the second region. In some embodiments, the method includes uncovering the bonding surface in the first region before the direct bonding. In some embodiments, providing the integrated MEMS device comprises depositing a plurality of layers on the carrier. In some embodiments, the method includes patterning the plurality of layers to define the integrated MEMS device. In some embodiments, the MEMS device comprises a piezoelectric actuator.

In another embodiment, a bonded structure is disclosed. The bonded structure can include a carrier having a first region and a second region laterally spaced from the first device region; an optical element directly bonded to a bonding surface of the first region without an intervening adhesive; and an integrated buildup structure in the second region extending vertically above the bonding surface in a direction non-parallel to the bonding surface, the integrated buildup structure comprising one layer or a plurality of layers on the carrier.

In some embodiments, the carrier comprises a photonics chip, wherein an optical element comprises an emitter die. In some embodiments, the emitter die comprises a side-emitting laser device die. In some embodiments, the buildup structure comprises an optical pathway having an optical port disposed vertically above the bonding surface in a direction non-parallel to the bonding surface, the optical port in optical communication with the optical element. In some embodiments, the bonded structure includes a processor element directly bonded to the buildup structure without an intervening adhesive.

In another embodiment, a bonded structure is disclosed. The bonded structure can include a carrier having a first region and a second region laterally spaced from the first device region; an optical device die directly bonded to a bonding surface of the first region without an intervening adhesive; and an optical pathway disposed in the second region and optically coupled with the optical device die, the optical pathway having an optical port disposed vertically above the bonding surface in a direction non-parallel to the bonding surface, the optical port in optical communication with the optical die.

In some embodiments, the carrier comprises a photonics chip, wherein an optical device die comprises an emitter die. In some embodiments, the emitter die comprises a side-emitting laser device die. In some embodiments, the bonded structure includes a processor element directly bonded to the optical pathway without an intervening adhesive.

In another embodiment, a method of forming a bonded structure is disclosed. The method can include providing a carrier having a first region and a second region laterally spaced from the first device region; providing an integrated buildup structure in the second region of the carrier, the integrated buildup structure comprising one layer or a plurality of layers on the carrier; and directly bonding an optical element to a bonding surface of the first region without an intervening adhesive, the buildup structure extending vertically above the bonding surface in a direction non-parallel to the bonding surface.

In some embodiments, the method includes planarizing the bonding surface. In some embodiments, the method includes covering at least a portion of the bonding surface with a protective sacrificial layer before providing the integrated buildup structure. In some embodiments, covering the bonding surface comprises providing an etch stop material in the first and second regions over the bonding surface. In some embodiments, covering the bonding surface comprises providing a patterned sacrificial material in the first region and not in the second region. In some embodiments, the method includes uncovering the bonding surface in the first region before the direct bonding.

Unless the context clearly requires otherwise, throughout the description and the claims, the words “comprise,” “comprising,” “include,” “including” and the like are to be construed in an inclusive sense, as opposed to an exclusive or exhaustive sense; that is to say, in the sense of “including, but not limited to.” The word “coupled”, as generally used herein, refers to two or more elements that may be either directly connected, or connected by way of one or more intermediate elements. Likewise, the word “connected”, as generally used herein, refers to two or more elements that may be either directly connected, or connected by way of one or more intermediate elements. Additionally, the words “herein,” “above,” “below,” and words of similar import, when used in this application, shall refer to this application as a whole and not to any particular portions of this application. Moreover, as used herein, when a first element is described as being “on” or “over” a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word “or” in reference to a list of two or more items, that word covers all of the following interpretations of the word: any of the items in the list, all of the items in the list, and any combination of the items in the list.

Moreover, conditional language used herein, such as, among others, “can,” “could,” “might,” “may,” “e.g.,” “for example,” “such as” and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only and are not intended to limit the scope of the disclosure.

Indeed, the novel apparatus, methods, and systems described herein may be embodied in a variety of other forms; furthermore, various omissions, substitutions, and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:

a carrier comprising a first nonconductive bonding layer, the carrier having a first region and a second region laterally spaced from the first region, the first nonconductive bonding layer disposed in the first and second regions;

an element comprising a second nonconductive bonding layer, the element directly bonded to a bonding surface of the first region without an intervening adhesive, wherein the bonding surface of the first region comprises at least a portion of the first nonconductive bonding layer of the carrier, and wherein the second nonconductive bonding layer of the element is directly bonded to the first nonconductive bonding layer of the carrier at the bonding surface of the first region; and an integrated buildup structure deposited directly onto and contacting the first nonconductive bonding layer in the second region, the integrated buildup structure extending vertically above the bonding surface of the first region in a direction non-parallel to the bonding surface of the first region, the integrated buildup structure comprising one or more layers with insulating and conductive materials on the carrier.

2. The bonded structure of claim 1, wherein the one or more layers are deposited onto the carrier.

3. The bonded structure of claim 1, wherein the one or more layers are transferred onto the carrier from a second carrier.

4. The bonded structure of claim 1, further comprising a second element directly bonded to a second bonding surface of the integrated buildup structure without an intervening adhesive.

5. The bonded structure of claim 1, wherein the one or more layers comprise an integrated device.

6. The bonded structure of claim 1, further comprising:

a second element mounted to the second region of the carrier, wherein the integrated buildup structure is formed on the second element.

7. The bonded structure of claim 1, wherein the first nonconductive bonding layer of the carrier comprises a dielectric material.

8. The bonded structure of claim 1, wherein the second nonconductive bonding layer of the element comprises a dielectric material.

9. The bonded structure of claim 1, wherein the integrated buildup structure comprises multiple layers.

10. A bonded structure comprising:

a carrier comprising a bonding layer, the carrier having a first nonconductive bonding region and a second nonconductive bonding region laterally spaced from the first nonconductive bonding region, the first nonconductive bonding region formed of a first nonconductive material and the second nonconductive bonding region formed of a second nonconductive material that has a different composition from the first nonconductive material, the first nonconductive bonding region comprising at least a portion of the bonding layer and the second nonconductive bonding region comprising an integrated buildup structure deposited directly onto and contacting the second nonconductive bonding region the bonding layer extending in the second nonconductive bonding region, the integrated buildup structure comprised of one or more layers on the carrier comprising one or more layers directly on the bonding layer extending in the second nonconductive bonding region, the one or more layers comprising insulating and conductive materials;

a first device having a first bonding layer directly bonded to the first nonconductive bonding region of the carrier without an intervening adhesive, wherein the first bonding layer of the first device is directly bonded to the bonding layer of the carrier at the first nonconductive bonding region; and a second device having a second bonding layer directly bonded to the second nonconductive bonding region of the carrier without an intervening adhesive.

11. The bonded structure of claim 10, wherein the integrated buildup structure in the second nonconductive bonding region extends vertically above the second nonconductive bonding region in a direction non-parallel to the second nonconductive bonding region, and wherein the second device is directly bonded to a bonding surface of the integrated buildup structure without an intervening adhesive such that the first and second devices are bonded to the carrier at different elevations.

12. The bonded structure of claim 10, further comprising forming a buildup structure onto at least one of the first device and the second device.

13. The bonded structure of claim 10, wherein the integrated buildup structure comprises multiple layers.

14. The bonded structure of claim 10, wherein the one or more layers are deposited onto the carrier.

15. The bonded structure of claim 10, wherein the one or more layers are transferred onto the carrier from a second carrier.

16. The bonded structure of claim 10, wherein the one or more layers are comprised of insulating and conductive materials.

* * * * *